(12) United States Patent
Rom et al.

(10) Patent No.: US 11,133,059 B2
(45) Date of Patent: Sep. 28, 2021

(54) NON-VOLATILE MEMORY DIE WITH DEEP LEARNING NEURAL NETWORK

(71) Applicant: Western Digital Technologies, Inc., San Jose, CA (US)

(72) Inventors: Rami Rom, Zichron-Yacov (IL); Ofir Pele, Hod Hasharon (IL); Alexander Bazarsky, Holon (IL); Tomer Tzvi Eliash, Kfar Saba (IL); Ran Zamir, Ramat Gan (IL); Karin Inbar, Ramat-Hasharon (IL)

(73) Assignee: WESTERN DIGITAL TECHNOLOGIES, INC., San Jose, CA (US)

( * ) Notice: Subject to any disclaimer, the term of this patent is extended or adjusted under 35 U.S.C. 154(b) by 0 days.

(21) Appl. No.: 16/212,596

(22) Filed: Dec. 6, 2018

(65) Prior Publication Data
US 2020/0185027 A1 Jun. 11, 2020

(51) Int. Cl.
G11C 11/56 (2006.01)
G06N 3/08 (2006.01)
(Continued)

(52) U.S. Cl.
CPC .......... *G11C 11/5628* (2013.01); *G06N 3/063* (2013.01); *G06N 3/084* (2013.01)

(58) Field of Classification Search
None
See application file for complete search history.

(56) References Cited

U.S. PATENT DOCUMENTS 6,545,907 B1 4/2003 Lowrey et al.
7,075,841 B2 7/2006 Resta et al.
(Continued)

FOREIGN PATENT DOCUMENTS

CN 106485317 A 3/2017
CN 107301455 A 10/2017
(Continued)

OTHER PUBLICATIONS

"Demystifying the Characteristics of 3D-Stacked Memories: A Case Study for Hybrid Memory Cube", Ramyad Hadidi, Bahar Asgari, Burhan Ahmad Mudassar, Saibal Mukhopadhyay, Sudhakar Yalamanchili, and Hyesoon Kim (Year: 2017).*
(Continued)

*Primary Examiner* — Michael Alsip
(74) *Attorney, Agent, or Firm* — Loza & Loza, LLP; Gabriel Fitch

(57) ABSTRACT

Exemplary methods and apparatus are provided for implementing a deep learning accelerator (DLA) or other neural network components within the die of a non-volatile memory (NVM) apparatus using, for example, under-the-array circuit components within the die. Some aspects disclosed herein relate to configuring the under-the-array components to implement feedforward DLA operations. Other aspects relate to backpropagation operations. Still other aspects relate to using an NAND-based on-chip copy with update function to facilitate updating synaptic weights of a neural network stored on a die. Other aspects disclosed herein relate to configuring a solid state device (SSD) controller for use with the NVM. In some aspects, the SSD controller includes flash translation layer (FTL) tables configured specifically for use with neural network data stored in the NVM.

20 Claims, 19 Drawing Sheets

(51) Int. Cl.
  *G06N 3/063* (2006.01)
  *G06N 3/04* (2006.01)
  *G11C 11/54* (2006.01)

(56) References Cited

U.S. PATENT DOCUMENTS

| | | |
|---|---|---|
| 7,274,586 B2 | 9/2007 | Choi et al. |
| 7,983,069 B2 | 7/2011 | Hsu et al. |
| 8,199,566 B1 | 6/2012 | Fackenthal et al. |
| 8,725,935 B2 | 5/2014 | Huang et al. |
| 9,530,491 B1 | 12/2016 | Uttarwar et al. |
| 9,646,243 B1 | 5/2017 | Gokmen |
| 9,880,760 B2 | 1/2018 | Inbar et al. |
| 2010/0027329 A1 | 2/2010 | Lee et al. |
| 2012/0311262 A1 | 12/2012 | Franceschini et al. |
| 2013/0013860 A1 | 1/2013 | Franceschini et al. |
| 2016/0085464 A1 | 3/2016 | Tuers et al. |
| 2016/0092129 A1 | 3/2016 | Agarwal et al. |
| 2017/0068451 A1 | 3/2017 | Kenan et al. |
| 2017/0200078 A1 | 7/2017 | Bichler |
| 2017/0270403 A1 | 9/2017 | Zhang |
| 2017/0337466 A1 | 11/2017 | Bayat et al. |
| 2018/0052766 A1 | 2/2018 | Mehra et al. |
| 2018/0075338 A1 | 3/2018 | Gokmen |
| 2018/0075344 A1 | 3/2018 | Ma et al. |
| 2018/0232508 A1* | 8/2018 | Kursun .............. G06N 7/02 |
| 2018/0330238 A1* | 11/2018 | Luciw ............... G06N 3/08 |
| 2019/0243787 A1* | 8/2019 | Mittal ............... G06F 9/445 |
| 2019/0258920 A1* | 8/2019 | Lie ................ G06F 9/30036 |

FOREIGN PATENT DOCUMENTS

| | | |
|---|---|---|
| KR | 20180028966 A | 3/2018 |
| KR | 20180116094 A | 10/2018 |

OTHER PUBLICATIONS

"A hybrid flash translation layer design for SLC-MLC flash memory based multibank solid state disk", Jung-Wook Park a, Seung-Ho Park, Charles C. Weems, Shin-Dug Kim (Year: 2010).*

Chi et al., "PRIME: A Novel Processing-in-memory Architecture for Neural Network Computation in ReRAM-based Main Memory", 2016 ACM SIGARCH Computer Architecture News Jun. 18, 2016 (vol. 44, No. 3, pp. 27-39). IEEE Press. <https://seal.ece.ucsb.edu/sites/seal.ece.ucsb.edu/files/publications/prime_isca_2016.pdf>.

Choe et al, "Near-Data Processing for Machine Learning", 2017, International Conference on Learning Representations. 12 pages. <https://openreview.net/pdf?id=H1_EDpogx>.

Sullivan, John, "Merging Memory and Computation, Programmable Chip Speeds AI, Slashes Power Use", Nov. 15, 2018, 5 pages <https://m.techxplore.com/news/2018-11-merging-memory-programmable-chip-ai.html>.

Jia et al, "A Microprocessor Implemented in 65nm CMOS with Configurable and Bit-scalable Accelerator for Programmable In-memory Computing", Nov. 9, 2018, 10 pages <https://arxiv.org/pdf/1811.04047.pdf>.

Valavi et al, "A Mixed-Signal Binarized Convolutional-Neural-Network Accelerator Integrating Dense Weight Storage and Multiplication for Reduced Data Movement", VLSI Symp. on Circuits (VLSIC), Jun. 2018. 2 pages. <http://www.princeton.edu/~nverma/VermaLabSite/Publications/2018/ValaviRamadgeNestlerVerma_VLSI18.pdf>.

Nielsen, Michael "Neural Networks and Deep Learning, Chapter 2: How the backpropagation algorithm works", 2015, 27 pages <http://neuralnetworksanddeeplearning.com/chap2.html>.

International Search Report and Written Opinion for International Application No. PCT/US2019/050105, dated Nov. 3, 2020, 13 pages.

* cited by examiner

NON-VOLATILE MEMORY DIE WITH DEEP LEARNING NEURAL NETWORK

CROSS-REFERENCE TO RELATED APPLICATIONS

This application is related to U.S. patent application Ser. No. 16/212,586, filed Dec. 6, 2018, titled "NON-VOLATILE MEMORY DIE WITH DEEP LEARNING NEURAL NETWORK", the content of which is incorporated by reference in its entirety.

FIELD

The disclosure relates, in some embodiments, to non-volatile memory (NVM) arrays and to data storage controllers for use therewith. More specifically, but not exclusively, the disclosure relates to methods and apparatus for implementing deep learning neural networks within an NVM die under the control of a data storage controller.

INTRODUCTION

Deep learning (which also may be referred to as deep structured learning or hierarchical learning) relates to machine learning methods based on learning data representations or architectures, such as deep neural networks (DNNs), rather than to task-specific procedures or algorithms Deep learning is applied to such fields as speech recognition, computer vision, and self-driving vehicles. Deep learning may be accomplished by, or facilitated by, deep learning accelerators (DLAs), e.g., microprocessor devices designed to accelerate the generation of useful neural networks to implement deep learning.

SUMMARY

The following presents a simplified summary of some aspects of the disclosure to provide a basic understanding of such aspects. This summary is not an extensive overview of all contemplated features of the disclosure, and is intended neither to identify key or critical elements of all aspects of the disclosure nor to delineate the scope of any or all aspects of the disclosure. Its sole purpose is to present various concepts of some aspects of the disclosure in a simplified form as a prelude to the more detailed description that is presented later.

One embodiment of the disclosure provides an apparatus that includes: one or more non-volatile memory (NVM) elements formed in a die; a neural network processing component formed under the die and coupled to the NVM elements, the neural network processing component configured to perform neural network operations using neural network data stored in the NVM elements; and an on-chip copy with update component configured to perform an on-chip copy of at least some updated synaptic weights stored in the NVM elements.

Another embodiment of the disclosure provides a method for neural network processing using an apparatus including NAND NVM elements. The method includes: sensing synaptic weights of a neural network stored within the NAND NVM elements; performing a neural network operation on the sensed synaptic weights, wherein the neural network operation modifies at least some of the synaptic weights; and performing a NAND-based on-chip copy and update within the apparatus to save the modified synaptic weights within the NAND NVM elements.

Yet another embodiment of the disclosure provides an apparatus that includes: an NVM array comprising a die with an on-chip copy with update component; a processor configured to generate a first mapping table that maps neural-network-weight units to corresponding virtual locations within the memory array, where a virtual location of the virtual locations is represented by a virtual block identifier corresponding to physical location in the memory array, generate a second mapping table that maps the virtual block identifier to a physical block identifier, convert a neural-network-weight unit to a virtual block identifier using the first table, and convert the virtual block identifier to a physical block identifier using the second table; and an output component configured to send the physical block identifier to the die of the NVM for processing in connection with the on-chip copy component of the die.

Still another embodiment of the disclosure provides a method for use by a controller of an apparatus that includes a memory array of NVM elements and an on-chip copy with update component. The method includes: generating a first mapping table that maps neural-network-weight unit to corresponding virtual locations within the memory array, where a virtual location of the virtual locations is represented by a virtual block identifier corresponding to physical location in the memory array; generating a second mapping table that maps the virtual block identifier to a physical block identifier; converting a neural-network-weight unit to a virtual block identifier using the first table; converting the virtual block identifier to a physical block identifier using the second table; and sending the physical block identifier to the memory array for processing in connection with the on-chip copy with update component of the memory array.

DETAILED DESCRIPTION

Figure 1:
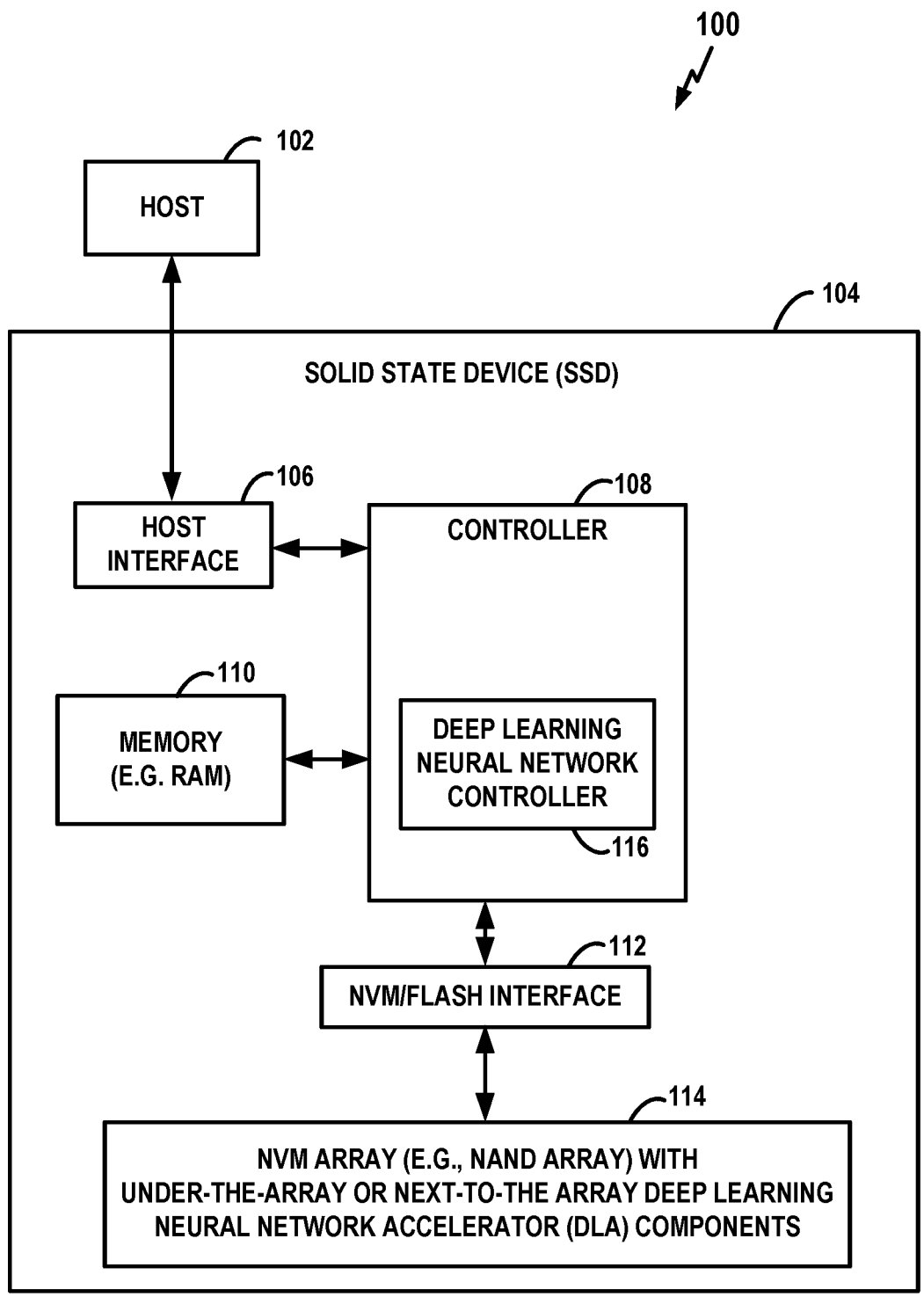
FIG. 1 shows a schematic block diagram configuration for an exemplary solid state device (SSD) having one or more non-volatile memory (NVM) array dies, where the dies have under-the-array or next-to-the-array deep learning accelerator (DLA) components.

In the following detailed description, reference is made to the accompanying drawings, which form a part thereof. In addition to the illustrative aspects, embodiments, and features described above, further aspects, embodiments, and features will become apparent by reference to the drawings and the following detailed description. The description of elements in each figure may refer to elements of proceeding figures. Like numbers may refer to like elements in the figures, including alternate embodiments of like elements.

The examples herein relate to non-volatile memory (NVM) arrays, and to data storage devices or apparatus for controlling the NVM arrays, such as a controller of a data storage device (such as an SSD), and in particular to NAND flash memory storage devices (herein "NANDs"). (A NAND is a type of non-volatile storage technology that does not require power to retain data. It exploits negative-AND, i.e. NAND, logic.) For the sake of brevity, an SSD having one or more NAND dies will be used below in the description of various embodiments. It is understood that at least some aspects described herein may be applicable to other forms of data storage devices as well. For example, at least some aspects described herein may be applicable to phase-change memory (PCM) arrays, magneto-resistive random access memory (MRAM) arrays and resistive random access memory (ReRAM) arrays.

As noted above, deep learning may be accomplished by, or facilitated by, deep learning accelerators (DLAs), e.g., microprocessor devices designed to accelerate the generation of deep neural networks (DNNs) to implement deep learning. These networks may also be referred to as learning networks. Herein, methods and apparatus are disclosed for implementing DLAs or other neural network components within the die of an NVM using, for example, under-the-array circuit components. Many of the examples that incorporate DLA components into an NVM die involve NAND-based arrays and may be referred to herein as DLA NAND arrays or DLA NAND architectures. In many of the examples, synaptic weight values are stored vertically within a die (such as within a 3D flash NAND array) in blocks so that synaptic values that belong to different neurons can be sensed and processed in parallel.

Note that a DNN is an example of an artificial neural network that has multiple layers between input and output layers. A DNN operates to determine a mathematical computation or manipulation to convert the input into the output, which might be a linear or non-linear computation. For example, the DNN may work through its layers by calculating a probability of each output. Each mathematical manipulation may be considered a layer. Networks that have many layers are referred to as having "deep" layers, hence the term DNN. In one particular example, the DNN might be configured to identify a person within an input image by processing the bits of the input image to yield identify the person, i.e. the output of the DNN is a value that identifies the particular person.

DNNs are often configured as feedforward networks, in which data flows from an input layer to an output layer in one direction. Initially, the DNN may generate a map of virtual "neurons" and assign initial numerical values or "weights" to connections between the neurons. The weights and inputs are multiplied to return output values between, e.g., 0 and 1. The weights may be adjusted in an attempt to improve the accuracy by which the network relates its input to a known output (to, for example, correctly identified an input image).

In one aspect of a DLA of a DNN, a feedforward computation for a single neuron activation in DNN is given by Equation 1 below, where multiply-accumulate (MAC) operations using synaptic weights are summed and then an activation function is calculated, which is often a maximum function (such as a rectifier linear activation function computed by a rectifier linear unit (RLU or ReLU)) or a sigmoid function. That is, in some examples, the feedforward computation involves a sum over weights (w) multiplied by input values (a) to each neuron in the network plus a bias value (b), the result of which is then applied to a sigmoid activation function ($\sigma$) to yield the next value in the network.

$$a^l_j = \sigma\left(\sum_k \omega^l_{jk} a^{l-1}_k + b^l_j\right) \quad (1)$$

In Equation 1, $w^l_{jk}$, denotes the weight for a connection from a $k^{th}$ neuron (or node) of the neural network) in an $(l-1)^{th}$ layer of the neural network to a $j^{th}$ neuron in an $l^{th}$ layer. The term $b^l_j$ denotes a bias of the $j^{th}$ neuron in the $l^{th}$ layer and $a^l_j$ denotes the activation of the $j^{th}$ neuron in the $l^{th}$ layer. Thus, the activation $a^l_j$ of the $j^{th}$ neuron in the $l^{th}$ layer is related to the activations in the $(l-1)^{th}$ layer. Note also that in Equation 1 the sum is over all neurons k in the $(l-1)^{th}$ layer. That is, for each layer, the weight w of each of the k neurons in the layer is multiplied by a corresponding activation value for the neuron, the values of this intermediate computation are summed together. This is the aforementioned MAC operation which multiplies individual w and a values and then accumulates (i.e. sums) the results. The appropriate bias value b is then added to the output of the MAC and result is applied to the sigmoid activation function ($\sigma$) to obtain the next activation value a. Note also that the zeroth layer of the neural network may be referred to as the input layer, the first layer of the neural network may be referred to as the first hidden layer, and the final layer of the neural network may be referred to as the output layer.

DLA learning schemes may be based on solving backpropagation equations to update the network weights (w).

Exemplary backpropagation equations are based on weighted sums using calculated δ terms (in the equations below in a matrix and vector form) for the output and so-called hidden layer neurons in the DNN (i.e. the intermediate layers between the input layer and the output layer) and wherein training values are employed.

Briefly, a cost function C may be defined:

$$C = \frac{1}{2n} \sum_x \|y(x) - a^L(x)\|^2 \qquad (2)$$

where n is a total number of training examples x, the sum is over individual training examples, x; y=y(x) is a corresponding desired output (e.g. a known output); L denotes the number of layers in the network; and $a^L=a^L(x)$ is a vector of activations output from the neural network when x is input.

Error values δ may be defined based on the cost function and a weighted input values z:

$$\delta_j^i \equiv \frac{\partial C}{\partial z_j^l}. \qquad (3)$$

where $\delta_j^l$ is the error of a neuron j in a layer l and where $z_j^l$ is a weighted input for the neuron j in the layer l. It is noted that the error $\delta_j^l$ is equal to a rate of change of C relative to the bias value b for the jth neuron of the lth layer, e.g.:

$$\frac{\partial C}{\partial b} = \delta \qquad (4)$$

where δ is evaluated at the same neuron as the bias b.

Four main backpropagation equations may then be defined:

$$\delta^L = \nabla_a C \odot \sigma'(z^L). \qquad (5)$$

$$\delta^l = \left((\omega^{l+1})^T \delta^{l+1}\right) \odot \sigma'(z^l) \qquad (6)$$

$$\frac{\partial C}{\partial b_j^l} = \delta_j^l \qquad (7)$$

$$\frac{\partial C}{\partial \omega_{jk}^l} = a_k^{l-1} \delta_j^l \qquad (8)$$

As these are standard backpropagation equations, they will not be described in detail herein, other than to note that the T of Eq. (6) indicates a matrix transpose, the σ' of Eq. (6) denotes a derivative of the sigmoid function σ, and the symbol ⊙ denotes a Hadamard product, i.e. an elementwise product of two vectors.

Based on these equations (or, in some cases, other standard backpropagation equations), the synaptic weights w of the DNN may be updated based on a desired output of the neural network y=y(x) provided by the user, which may be input for training purposes and used in conjunction with the existing bias values b, weights w and activation values a already stored. For example, the desired outputs, y(x), sometimes called in the literature "learning labels" or "learning targets" of a supervised learning scheme may be provided by the user/host device to the DLA NAND.

For complex DNNs—especially massive DNNs with many layers—the computation of the many feedforward values and the backpropagation values can be time consuming. Hence, it would be desirable to provide a high performance DNN system configured for massive parallel neural network processing that is fast, efficient and consumes low power.

Some aspects disclosed herein relate to configuring under-the-array (or next-to-the-array) components of a NAND die to implement feedforward neural network operations and computations. (Herein, the main examples discussed are under-the-array examples, but the on-die logic/circuit can be also implemented, in at least some examples, as next-to-the-array logic/circuit. That is, the disclosure herein is not limited to under-the-array circuitry.) Other aspects relate to configuring the under-the-array components to implement backpropagation operations and computations. Still other aspects relate to using a NAND-based on-chip copy function to update synaptic weights during backpropagation operations. Other methods and apparatus are disclosed for configuring a controller (e.g., a SSD controller) to control the DLA of an NVM die. In some aspects, the SSD controller is provided with flash translation layer (FTL) tables configured for efficient use with the types of neural network data stored in the NVM die, such as FTL tables configured for use with synaptic weights whose values may change but whose overall structure typically does not change.

Thus, in some examples, a high performance DNN system is disclosed that includes flash NAND dies with under-the-array circuitry to perform computations based on data and weights store in NAND data blocks. In some examples, the aforementioned feedforward MAC operations, e.g. the weighted sum of Eq. 1, are implemented by a NAND die for a very large number of neuron cells in parallel (e.g., ~4000 cells per die plane) with no need to transfer the stored weights data to the NAND controller or to a host device.

The aforementioned backpropagation operations also may be implemented by the NAND die without the need to transfer adjusted weights data to the NAND controller or to the host device. That is, in some examples, the learning backpropagation equations used for training the DLA of the NAND die are performed by under-the-array components NAND die. In some examples, the synaptic weights stored within NAND blocks are updated using an off-chip read-modify-write operation where the read-modify-write utilizes an external component such as a dynamic RAM (DRAM). In other examples, a NAND-based on-chip-copy operation is used to update the synaptic weights. In one particular example, the on-chip copy involves self-folding three single layer cell (SLC) pages into a single tri-layer cell (TLC) word line (WL) having an upper, middle and lower pages, e.g. a weight-adapting on-chip copy operation is disclosed. That is, on-chip copy operation is generalized or modified herein to include logic and/or mathematical operations (e.g. the backpropagation equations above) before the data is folded and written back to a WL. In other examples, other multi-level cells (MLCs) such as quad-level cells (QLCs) may be used. (Herein, the term MLC is intended to cover any multiple level cell, such as TLC and QLC.) The weight-adapting on-chip copy operation may be, e.g., SLC to SLC, SLC to MLC, TLC, QLC and MLC to MLC, TLC to TLC, and/or QLC to QLC. In other embodiments, the learning backpropagation equations and the read-modify-write operations may be performed by a storage device controller with partial (or without any) NAND die assistance.

Note that the FTL components operate to maintain control tables that associate the host data to the relevant neural network weights that the NAND die should use when reading the data, as well as information regarding the location of the weights in the NAND die (that is, the Physical Block Address (PBA)). In some examples, the association between host data to weights can conform to a certain ratio, e.g., 32K of weights for each full SLC host block. In some examples, the weights are stored in the NAND die in separate blocks, which allows the NAND to perform certain maintenance operation on these blocks separately. Moreover, in some examples described herein, the FTL of the storage device controller is configured to support the DLA learning process by allocating a new target block in the NAND die for each source block or a new MLC target block for several source SLC blocks in case of SLC to MLC copy. The generalized weight-adapting on-chip copy operation (i.e. on-chip copy with update operation) may be performed by the die, which then sends a command completion response to the controller so the FTL components of the controller are notified that the copy has ended and the physical block address (PBAs) of the weights have changed. At this point, the FTL component releases the source blocks and updates the physical block address (PBA) of the weights that were copied. During a subsequent DLA operation, the NAND die receives the updated PBAs for the neural network weights from the controller (e.g., as part of the command).

In some examples, a first FTL table maps a neural-network-weight unit to a virtual location represented by a "virtual-block-ID" (along with, in some examples, a page-in-block identifier). The virtual-block-ID corresponds to a physical location in the NAND die but identifies the physical location using a block-ID that is logical. A second FTL table maps the virtual-block-ID to a "physical-block-ID." With this arrangement, when updating location of "weights" at the end of DLA operation, the FTL components of the controller need not search for "weight units" that were copied (by, e.g., scanning FTL tables, by reading the headers in the block, or by maintaining a reverse table, etc.). In addition, the FTL components need not update each "weight unit" separately but rather may just update a single entry in the second FTL table (which maps the association of the virtual-block-ID into a new physical-block-ID) so as to simplify the FTL and reduce overhead. (The weight units may include or correspond to or be otherwise related to the synaptic weights stored in the NAND die.) For the case that DLA copies several SLC blocks to one MLC block, the virtual-block-ID represents a block at the size of an SLC block, and each MLC block is associated with several virtual-block-IDs, each mapping a relative portion of the block. The $2^{nd}$ FTL table maps a virtual-block-ID to a physical SLC block or to a portion of an MLC block.

Note that garbage collection, compaction operations, wear leveling and other flash management operations may be required for the NAND blocks that store the synaptic weights as each "weight" unit is associated with separate host-data portion, which may get invalidated or updated separately. Yet, the use of the two FTL tables, i.e. a "weight"-to-virtual-location (with "virtual-block-ID") table and a "virtual-block-ID"-to-"physical-block-ID" table may be quite beneficial for the NAND die array, since the basic maintenance operation of DLA is done in full block granularity, for which NAND flash management operations can be minimized or reduced, thus simplifies the system by allowing independent updates by the NAND and also providing higher performance to the host.

An advantage of at least some of the exemplary DLA NAND architectures and systems describe herein is that only the final result of a DLA procedure is transferred back to the controller, thus avoiding the transfer time of all 64 WLs (for example) of a NAND block. Note that the DLA NAND dies described herein are different from graphics processing unit (GPUs) in that a GPU transfers calculated data from its NVM to a volatile RAM/DRAM, whereas the DLA computations described in various examples herein are done by the NAND dies. As noted, in some examples, the DLA NAND die includes under-the-array logic for performing the logic and/or mathematical operations, storing temporary results, performing the back propagation computations, generalized on-chip copies, and other on-chip operations. Thus, in some aspects, a DLA NAND architecture is disclosed that offloads DLA computations from host devices or other devices and instead performs DLA computations for DNN processing in memory using synaptic weights and other DNN data.

Overview

FIG. 1 is a block diagram of a system 100 including an exemplary SSD having an NVM with under-the-array deep learning DLA components in accordance with aspects of the disclosure. The system 100 includes a host 102 and a SSD 104 coupled to the host 102. The host 102 provides commands to the SSD 104 for transferring data between the host 102 and the SSD 104. For example, the host 102 may provide a write command to the SSD 104 for writing data to the SSD 104 or read command to the SSD 104 for reading data from the SSD 104. The host 102 may be any system or device having a need for data storage or retrieval and a compatible interface for communicating with the SSD 104. For example, the host 102 may a computing device, a personal computer, a portable computer, a workstation, a server, a personal digital assistant, a digital camera, or a digital phone as merely a few examples. Additionally or alternatively, the host 102 may be a system or device having a need for neural network processing, such as speech recognition, computer vision, and self-driving vehicles. For example, the host 102 may be a component of a self-driving system of a vehicle.

The SSD 104 includes a host interface 106, a controller 108, a memory 110 (such as a random access memory (RAM)), an NVM interface 112 (which may be referred to as a flash interface), and an NVM 114, such as one or more NAND dies. The host interface 106 is coupled to the controller 108 and facilitates communication between the host 102 and the controller 108. The controller 108 is coupled to the memory 110 as well as to the NVM 114 via the NVM interface 112. The host interface 106 may be any suitable communication interface, such as an Integrated Drive Electronics (IDE) interface, a Universal Serial Bus (USB) interface, a Serial Peripheral (SP) interface, an Advanced Technology Attachment (ATA) or Serial Advanced Technology Attachment (SATA) interface, a Small Computer System Interface (SCSI), an IEEE 1394 (Firewire) interface, or the like. In some embodiments, the host 102 includes the SSD 104. In other embodiments, the SSD 104 is remote from the host 102 or is contained in a remote computing system communicatively coupled with the host 102. For example, the host 102 may communicate with the SSD 104 through a wireless communication link.

The controller 108 controls operation of the SSD 104. In various aspects, the controller 108 receives commands from the host 102 through the host interface 106 and performs the commands to transfer data between the host 102 and the NVM 114. Furthermore, the controller 108 may manage reading from and writing to memory 110 for performing the various functions effected by the controller and to maintain and manage cached information stored in memory 110.

The controller 108 may include any type of processing device, such as a microprocessor, a microcontroller, an embedded controller, a logic circuit, software, firmware, or the like, for controlling operation of the SSD 104. In some aspects, some or all of the functions described herein as being performed by the controller 108 may instead be performed by another element of the SSD 104. For example, the SSD 104 may include a microprocessor, a microcontroller, an embedded controller, a logic circuit, software, firmware, or any kind of processing device, for performing one or more of the functions described herein as being performed by the controller 108. According to other aspects, one or more of the functions described herein as being performed by the controller 108 are instead performed by the host 102. In still further aspects, some or all of the functions described herein as being performed by the controller 108 may instead be performed by another element such as a controller in a hybrid drive including both non-volatile memory elements and magnetic storage elements.

The memory 110 may be any suitable memory, computing device, or system capable of storing data. For example, the memory 110 may be ordinary RAM, DRAM, double data rate (DDR) RAM (DRAM), static RAM (SRAM), synchronous dynamic RAM (SDRAM), a flash storage, an erasable programmable read-only-memory (EPROM), an electrically erasable programmable ROM (EEPROM), or the like. In various embodiments, the controller 108 uses the memory 110, or a portion thereof, to store data during the transfer of data between the host 102 and the NVM 114. For example, the memory 110 or a portion of the memory 110 may be a cache memory. The NVM 114 receives data from the controller 108 via the NVM interface 112 and stores the data. The NVM 114 may be any suitable type of non-volatile memory, such as a NAND-type flash memory or the like.

In the example of FIG. 1, the controller 108 may include hardware, firmware, software, or any combinations thereof that provide a deep learning neural network controller 116 for use with the NVM array 114. The neural network controller 116 may be configured with FTL components (not shown in FIG. 1) that include first and second tables configured as discussed above to work efficiently with DNN array data stored in the NVM array 114.

Although FIG. 1 shows an example SSD and an SSD is generally used as an illustrative example in the description throughout, the various disclosed embodiments are not necessarily limited to an SSD application/implementation. As an example, the disclosed NVM die and associated processing components can be implemented as part of a package that includes other processing circuitry and/or components. For example, a processor may include, or otherwise be coupled with, embedded NVM and associated circuitry and/or components for deep learning that are described herein. The processor could, as one example, off-load certain deep learning tasks to the NVM and associated circuitry and/or components. As another example, the controller 108 may be a controller in another type of device and still include the neural network controller 116 and perform some or all of the functions described herein.

Figure 2:
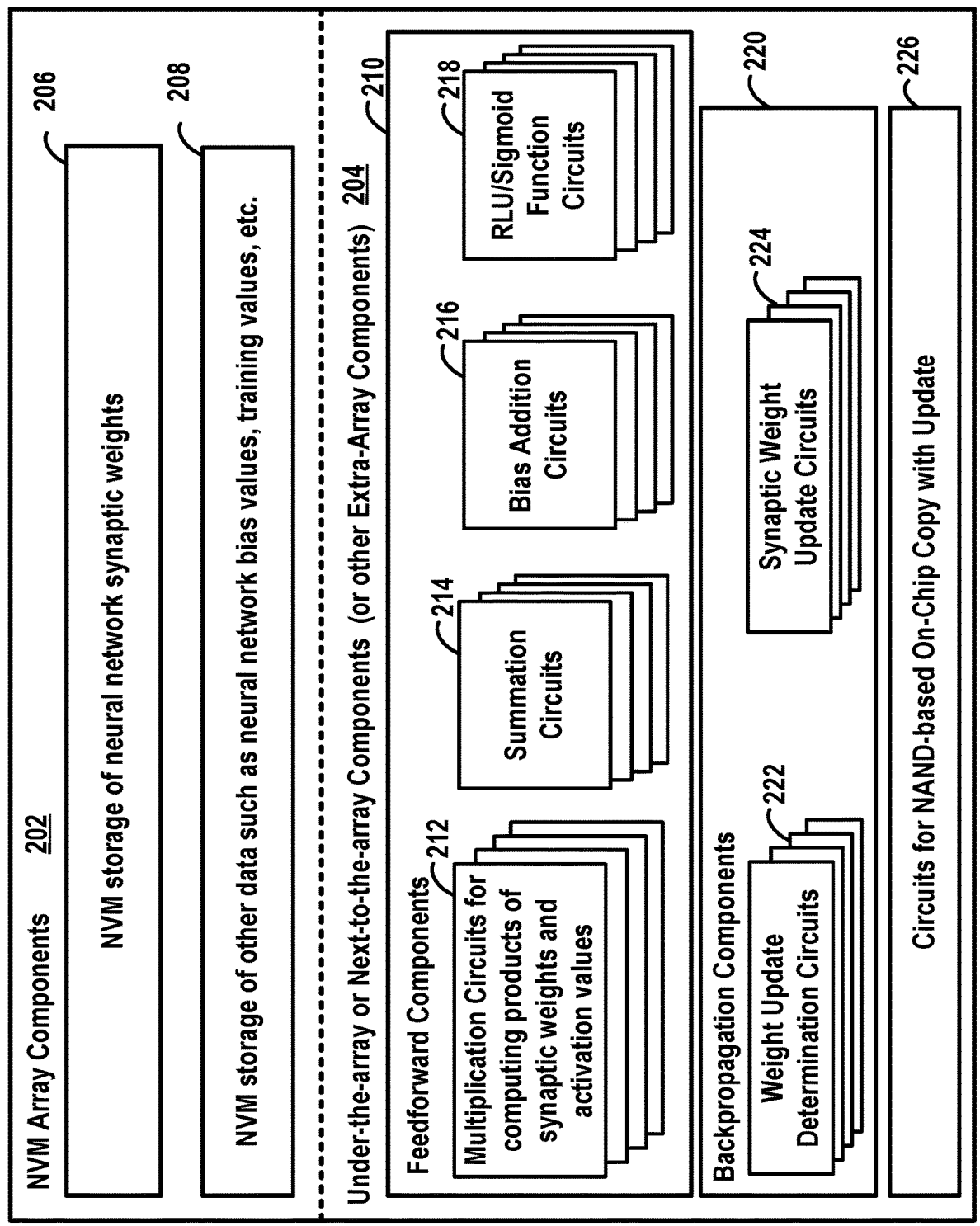
FIG. 2 illustrates an example of an NVM die having under-the-array or next-to-the-array components configured for neural network processing.

FIG. 2 illustrates a block diagram of an exemplary NVM die 200 that includes NVM storage array components 202 and under-the-array or next-to-the-array (or other extra-array) processing components 204 (processing components 204). (Noted that not all circuit or memory components that might be used in a practical NVM die are illustrated in the figure, such as input and output components, voltage regulation components, clocks and timing components, etc. Rather only some components and circuits are shown, summarized as block or schematic diagrams.) The NVM array components 202 include NVM storage 206 configured for storing neural network synaptic weights and NVM storage 208 configured for storing other data such as neural network bias values, training values, etc. Note that the data stored in NVM storage 208 may include non-neural network related data.

The NVM processing components 204 include feedforward components 210 configured to perform feedforward neural network operations, such as computing values in accordance with Equation 1, above. In the example of FIG. 2, the feedforward components 210 include: a set of multiplication circuits 212 configured to operate in parallel to compute the products of synaptic weights and activation values (as in, e.g., Equation 1); a set of summation circuits 214 configured to operate in parallel to sum such products (as in, e.g., Equation 1); a set of bias addition circuits 216 configured to operate in parallel to add bias values to the sums (as in, e.g., Equation 1); and a set of RLU/sigmoid function circuits 218, configured to operate in parallel to compute RLU or sigmoid functions of the resulting values (as in, e.g., Equation 1). It is noted that, currently, the RLU function is more typically used within deep neural networks currently, as opposed to a sigmoid. In FIG. 2, only four instances of each of the aforementioned feedforward circuits are shown; however, it should be understood that far more circuits can be configured in parallel with, e.g., separate circuits provided for each of the N layers of a neural network.

The NVM processing components 204 also include backpropagation components 220 configured to perform backpropagation neural network operations, such as to compute values in accordance with Equations 5-8, above. In the example of FIG. 2, the backpropagation components 220 include: a set of weight update determination circuits 222 configured to operate in parallel to compute updates to the synaptic weights (as in, e.g., Equations 5-8) and a set of synaptic weight update circuits 224 configured to operate in parallel to update the synaptic weights stored in NVM storage 206 using the updates computed by circuit 222. In some examples, the update exploits one or more on-chip copy with update circuits 226. (As with the feedforward circuits, only four instances of each of the backpropagation circuits 222 and 224 are shown; however, it should be understood that more circuits can be configured in parallel with, e.g., separate circuits provided for each of the N layers of a neural network.)

The feedforward operations and backpropagation operations may be performed iteratively or sequentially using the various weight and bias values of a neural network stored in the NVM array 202, as well as activation values or training values input from an SSD. Initially, default values for the synaptic weights and biases may be input and stored in the NVM array 202. For the purposes of the following descriptions, it is assumed that a set of weights and biases are already stored for use. In an illustrative example, to perform feedforward computations in accordance with Equation 1, a current set of synaptic weights w for the neurons of the first layer of the neural network are sensed from NVM storage 206. The multiplication circuits 212 and the summation circuits 214 may include various components arranged in parallel to multiply individual synaptic weights w with the corresponding activation values a and then sum the results for all of the neurons of the network. Bias values b are sensed from NVM storage 208 and added to the output of the summation circuit 214 using the bias addition circuits 216. Once the biases have been added, the sigmoid function (or RLU) for each result is then computed using the sigmoid/RLU function circuits 218 to yield resulting activation values (e.g. the activation $a^l_j$ of a $j^{th}$ neuron in the next layer). These operations proceed layer by layer until each of the layers of the neural network has been processed and a final result calculated, which may be output to the SSD or host.

For backpropagation, synaptic weights and other values (such as bias values) are sensed from the NVM array 202. Values corresponding to the aforementioned desired or known outputs/training values (e.g. y=y(x)) for the neural network may be input from the host. The weight update determination circuits 222 then perform the computations of Equations 5-8, above, to generate updates to the synaptic weights. The updates are applied to the stored synaptic weights of NVM storage 206 by update circuits 224. In some examples, the synaptic weight update circuits 224 exploit an off-chip read-modify-write operation to store the updated synaptic weights within the NVM storage 206. The off-chip read-modify-write operation may be performed in conjunction with a separate component such as a DRAM of the SSD controller. In other examples, as will be described more fully below, the NAND-based on-chip copy with update circuit 226 performs the weight update operation, without the need for an external component to perform the update.

Once a full series of neural network computations have been completed, such as a full set of feedforward computations to generate a final output result, or a full set of backpropagation computations to update the synaptic weights, or an on-chip copy with update has been completed, a suitable notification signal or indicator value may be sent to the SSD controller using an output component (not shown in FIG. 2). Depending upon the implementation, the controller device may then update its FTL tables or perform other suitable operations in response to the completion of the DLA operations.

Figure 3:
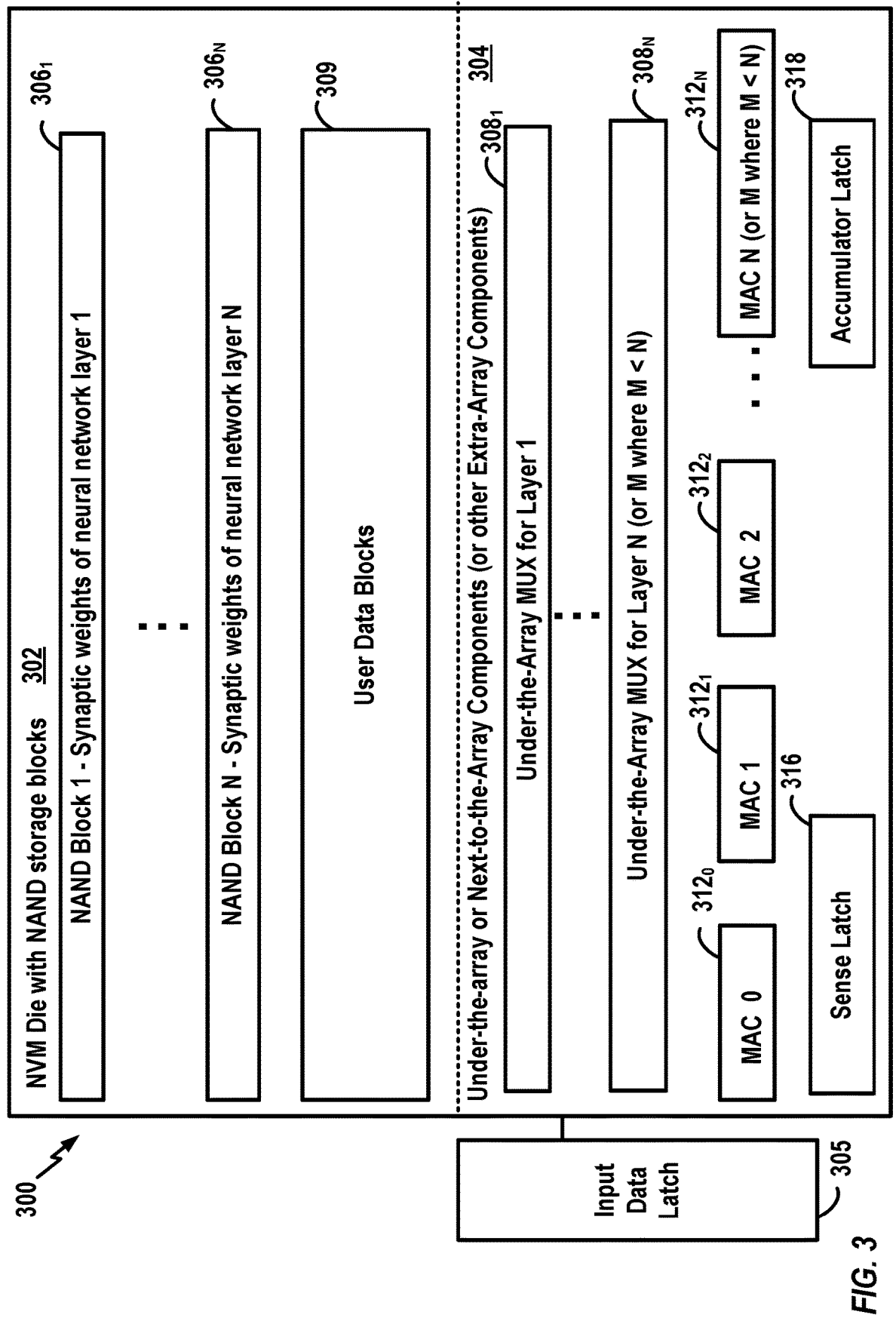
FIG. 3 illustrates another example of an NVM die having under-the-array or next-to-the-array components configured for neural network processing.

FIG. 3 illustrates selected components of an NVM die 300 that highlights particular exemplary feedforward components. The die 300 includes an NVM array 302 and under-the-array or next-to-the-array components 304 (processing components 304). The under-the-array or next-to-the-array components may also be generally regarded as, or referred to as, extra-array components in the sense that they are formed, mounted, or positioned outside of the array, or may be referred to as ancillary components, auxiliary components, non-array components, non-top-of-the-array components, or non-embedded-in-the-array components. The die 300 is shown coupled to an input data latch or register 305. In some examples, the data latch is an under-the-array component of the die. In other examples, the latch might be a separate component, such as volatile memory register. Latch 305 is shown separately from the die for the sake of generality. In some examples, latch 305 is configured to store sixty-four (64) entries ($x_1$-$x_{64}$). Die 300 also includes a set of N NVM blocks, labeled $306_1$ through $306_N$. These may be used to store synaptic weights for each of the N layers of a neural network, where N may be, for example, 1000. That is, in some examples, 1000 such NAND blocks are stored on the die. Other values, such as bias values, may be stored elsewhere, such as within a set of user data blocks 309. For each layer of the neural network, the die 300 includes a corresponding under-the-array multiplexer (MUX), $308_1$-$208_N$, which may be used to facilitate feedforward computation procedures.

In the example of FIG. 3, the processing components 304 additionally include: a set of MAC circuits, labeled $312_0$ through $312_N$; a sense latch 316; and an accumulator latch 318. The N MAC units are configured in this example to perform the aforementioned multiply-accumulate computations and to add the bias value and compute the sigmoid/RLU functions (so that separate bias and sigmoid/RLU components are not needed).

In one particular example, to perform feedforward computations in accordance with Equation 1, a current set of synaptic weights w for the neurons of the first layer of the neural network are sensed from the first NAND block $306_1$ into the sense latch 316 (e.g. a first WL of data is read from the NAND die) and an initial set of input values (which may be the aforementioned activation values a for the neurons of the zeroth or input layer) are input from the controller 108 of FIG. 1 into latch 305. (Alternatively, such input values a may be obtained from data blocks 309, if already stored therein) The set of MAC components 312 operate in parallel to perform the operations of Equation 1 to yield a resulting activation value (e.g. the activation $a^l_j$ of a $j^{th}$ neuron in the next layer). These operations and computations may utilize sense latch 316 and accumulator latch 318. Intermediate values may be stored, as needed, in latch 305 or in other storage elements, not shown. For example, the result of the feedforward operations for the first layer may be stored in sense latch 316 with the values from each layer accumulated in latch 318. These operations proceed layer by layer until each of the layers has been processed and the final result is stored in accumulator latch 318. The values of the accumulator latch 318 may be output to a separate device, such as the SSD controller that is controlling the NVM (using an output component not shown).

In some examples, an individual synaptic weight is represented by four (4) bytes, and so four thousand (4000) synaptic weights may be stored in a NAND page of 16 K bytes. A typical NAND sense operation typically takes about 50 microseconds and so, if there are 4000 weight values in a page and thirty-two planes (on sixteen dies) in the storage device being operated in parallel, 3.56 million MACs per second per SSD may be achieved. In some examples, an array of SSDs may be used so as to multiply the computing power of the overall system with 3.56 million MACs per SSD.

Alternative implementations (illustrated by FIGS. 5 and 6 and discussed below) instead use one (or several) configurable MUX(es) with the configurable MUX(es) updated for each block and layer currently computed, and likewise for the MAC units. That is, rather than having N MUXes and N MACs, the die includes, for example, M MUXes and M MACs, where M<N. (This is indicated in FIG. 3.) In this regard, in some examples, it may not be feasible to implement all N MAC units for the entire network in parallel as it might cost too much and consume too much power. And so there can be one (or several) MAC units for each block/layer, with the DLA configured to configure them one after the other, each time loading the correct MUX connectivity for the relevant synaptic weights for each block and layer. Hence, FIG. 3 primarily illustrates an example where there is one MAC and one MUX per of the N layers, but it also indicates that there can be fewer MACs and MUXes, configured as just described, e.g. M such components with M<N. Note also that in some examples there may be a different number of MACs than MUXes. For example, there might be one MUX and M MACs.

Figure 4:
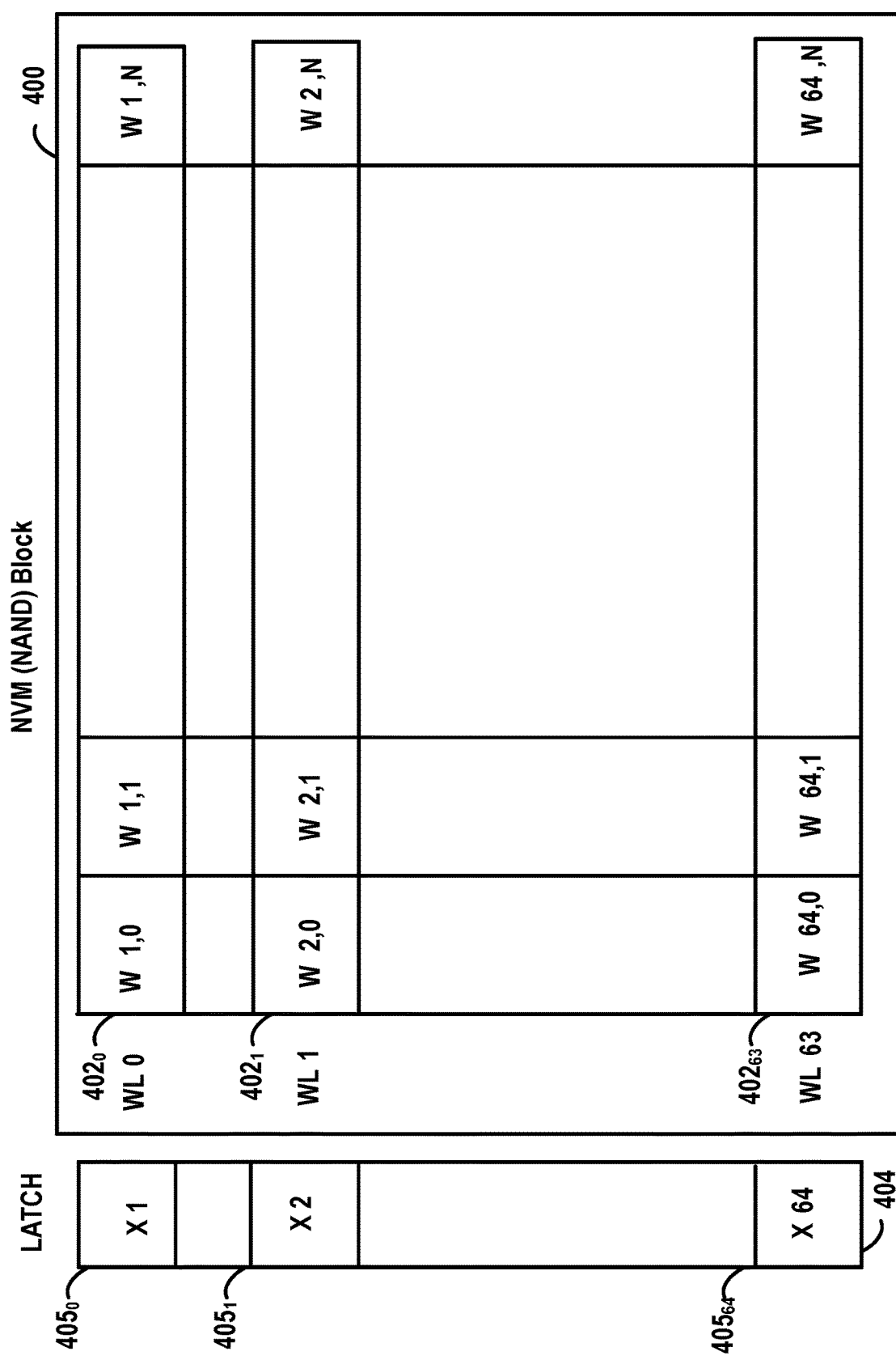
FIG. 4 illustrates an example of a NAND block for storing synaptic weights in word lines that can be sensed in parallel by under-the-array or next-to-the-array die components.

FIG. 4 illustrates an exemplary NAND block 400, which has data stored in sixty-four WLs, $402_0$-$302_{63}$. FIG. 4 also illustrates an input latch 404 that has one entry per WL, $402_0$-$302_{63}$. Each WL of the NAND block 400 stores N weight values W. The weights of WL 0 are denoted $W_{1,0}$-$W_{1,N}$; the weights of WL 1 are denoted $W_{2,0}$-$W_{2,N}$; and so on. (The indices are, of course, arbitrary and different indices may be used.) In other examples, the latch 404 might have more or fewer entries and might store, e.g., N entries, rather than only sixty-four. For feedforward computations, weight values w may be sensed from a WL (and stored in the sense latch 316 shown in FIG. 3), then multiplied against activation values a stored in the input latch and summed (using MACs $212_1$-$212_N$). As already explained, bias values b may be sensed during the feedforward computations and added to the summed MAC output values, with the results applied to the sigmoid function to compute a next set of activation values. For backpropagation computations, weight values w may be sensed from the WLs, updated using the aforementioned backpropagation components, which compute values using the formulae of Equations 5-8, above, based on the desired (e.g. known) output value. The updated weight values may be saved in the NVM using off-chip read-modify-write or NAND-based on-chip copy (with the updated values stored in a different NAND block of the NVM array).

Figure 5:
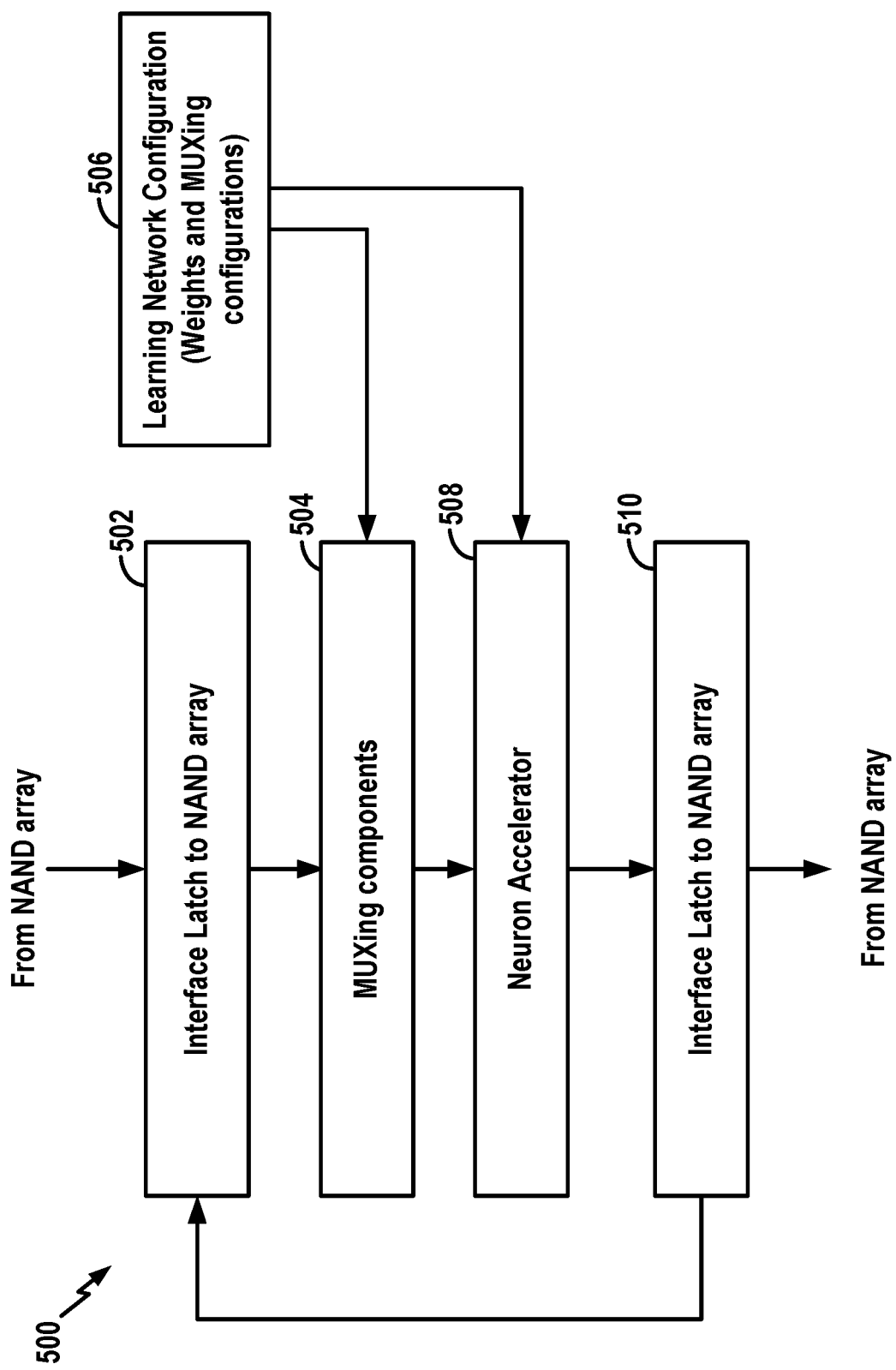
FIG. 5 illustrates a flow chart of an exemplary method according to aspects of the present disclosure for performing neural accelerator operations.

FIG. 5 illustrates a method 500 according to aspects of the present disclosure, which summarizes aspects of DLA processing and components employed to implement a method for feedforward computations where, for example, fewer than N MUXes and N MACs can be used for a neural network with N layers. Beginning at block 502, for a first layer of a DNN, data is input from a NAND array using an interface latch, such as a sense latch. At block 504, DNN data in the latch is multiplexed in accordance with a MUXing configuration specified by a learning network configuration 506. The MUXing configuration may, for example, specify the manner with which values sensed from the NAND blocks are routed to various MACs to enable feedforward processing. For example, the MUXing configuration at block 506 may define full or partial connectivity between layers, where in some cases not all neuron outputs of a previous layer are connected to neurons of the next layer. The learning network configuration may also specify a current set of synaptic weights, bias values, etc. That is, the learning network configuration may be representative of the current configuration of the DNN. At block 508, the multiplexed data is applied to neuron accelerator components (e.g., a set of MACs, bias adders, RLU or sigmoid function circuits, etc.) along with synaptic weights of the network configuration 506 for the layer. At block 510, the output of the accelerator components (such as, e.g., feedforward activation values for the next layer of the network) is stored in another interface latch, e.g. an accumulator latch. The operations of blocks/components 502, 504, 508 and 510 may be repeated for each layer of the DNN, with the final output returned to the NAND array for storage or output to the SSD controller and then to a host device, such as a self-driving vehicle control system.

Figure 6:
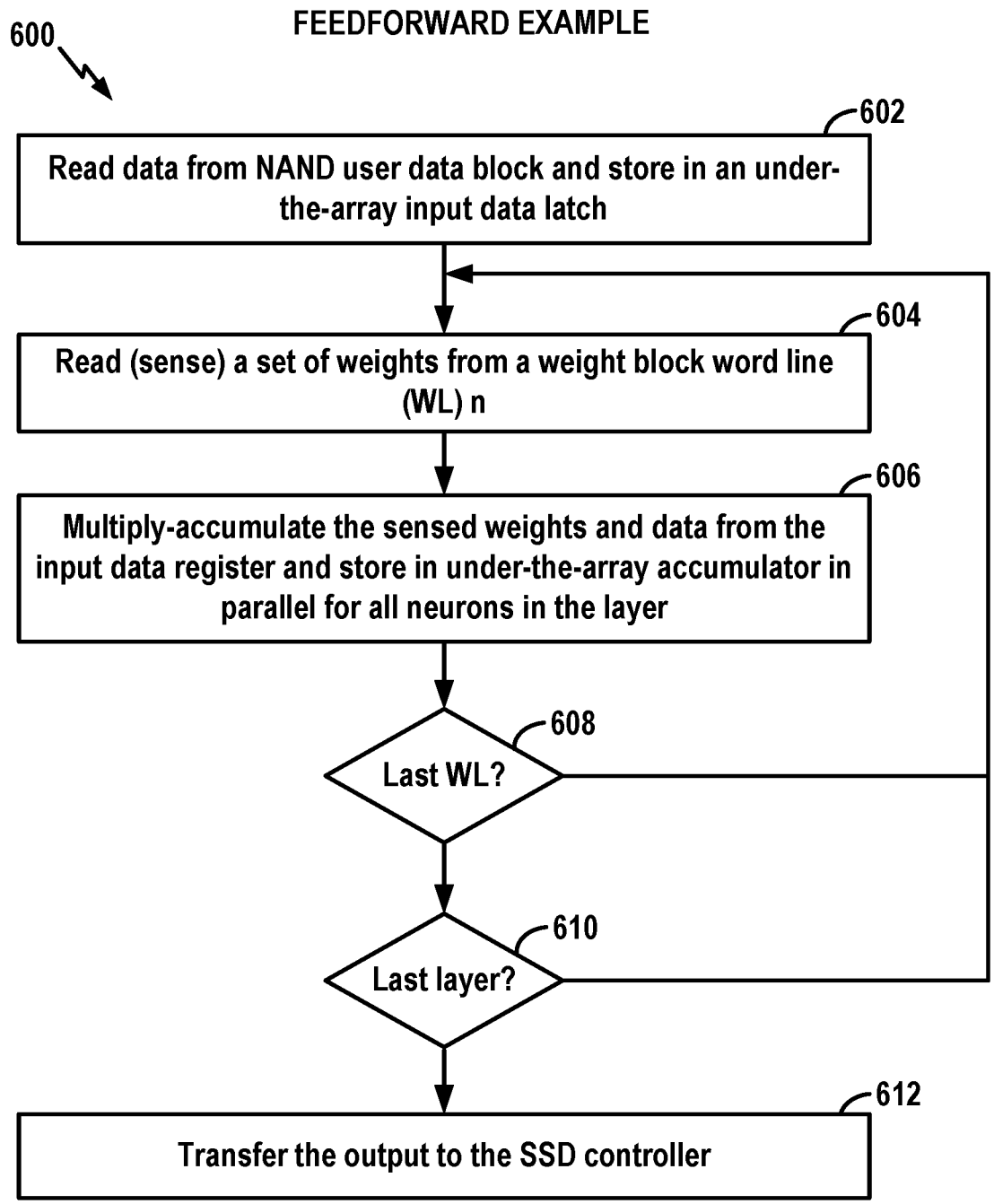
FIG. 6 illustrates a flow chart of exemplary feedforward operations.

FIG. 6 illustrates a method 600 according to aspects of the present disclosure, which summarizes various aspects of feedforward DLA processing for an example where the input data (e.g. activation values) are read from a NAND user block. Beginning at block 602, data is read from the NAND user data block and stored in an under-the-array input data latch. At block 604, a set of weights are read (sensed) from a weight block word line (WL) n. (Note that, although examples may be described herein that refer to under-the-array components, it should be understood that next-to-the array components or other extra-array components are also contemplated even if not explicitly mentioned.) At block 606, the sensed weights and the data from the input data register are multiply-accumulated and stored in an under-the-array accumulator in parallel for all neurons in a current layer. If, at decision block 608, the current iteration is not the last WL, processing returns to read another WL of weights at block 604 and another set of MAC operations are performed at block 606 for the same layer. The procedure repeats for each of the WLs of synaptic weight data, then advances to the next layer. If, at decision block 610, the current layer is not the last layer, processing returns to read a WL of weights at block 604 for the next layer and another set of MAC operations are performed at block 606 for that next layer. The procedure repeats for each of the WLs of synaptic weight data of that next layer. Once all layers have been processed, the final output is transferred to the SSD controller. For an example where the DNN is intended to process an input visual image to identify an object in the image, the final output may be an indicator that identifies the object, or a set of values that the SSD (or the host) can then use to identify the object.

Figure 7:
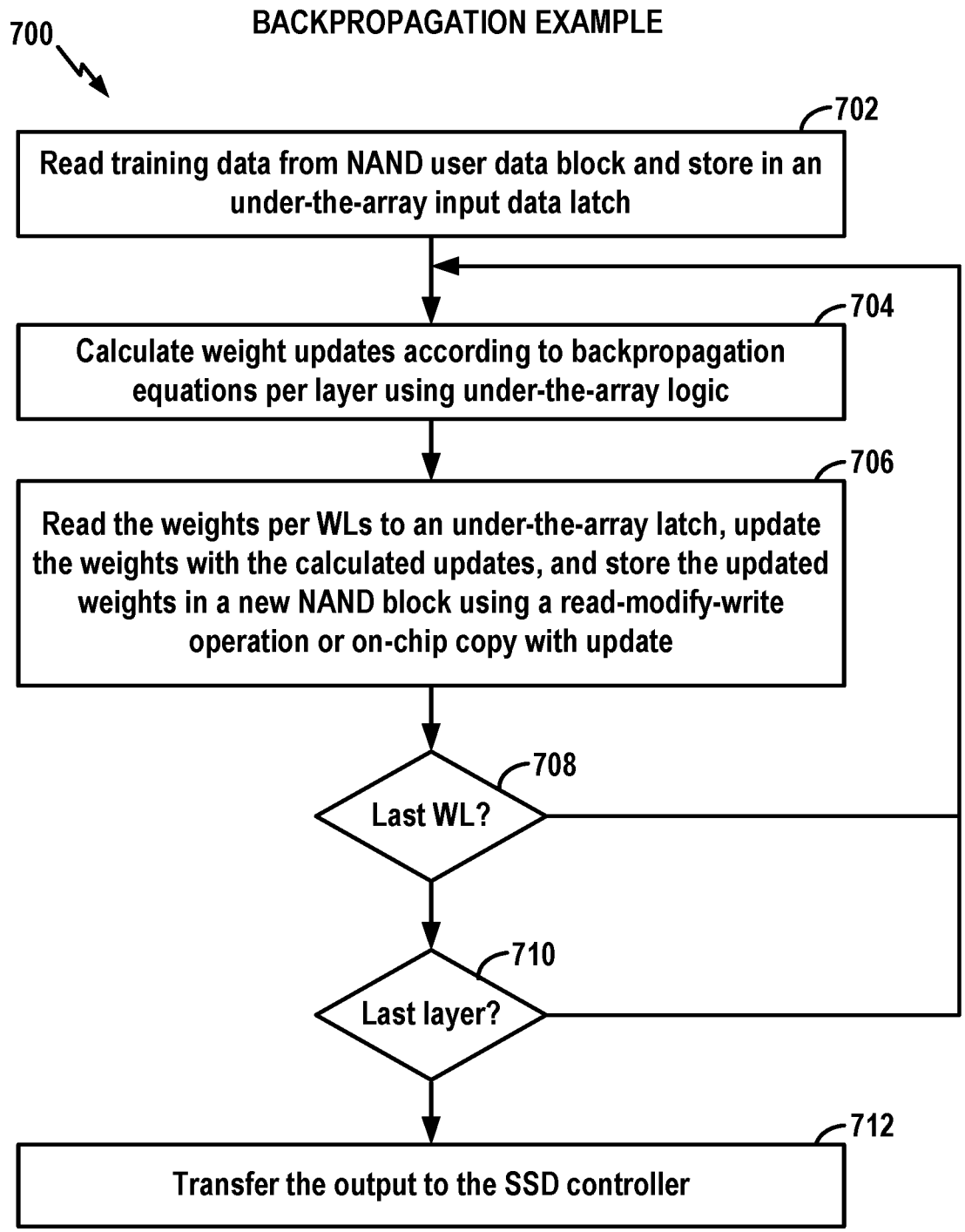
FIG. 7 illustrates a flow chart of exemplary backpropagation operations.

FIG. 7 illustrates a method 700 according to aspects of the present disclosure, which summarizes aspects of backpropagation DLA processing for an example where the input data (e.g. training values) are read from a NAND user block. Beginning at block 702, training data is read from the NAND user data block and stored in an under-the-array input data latch. At block 704, a set of weights updates are calculated according to backpropagation equations per layer using under-the-array logic. At block 706, the weights for a current WL are read into an under-the-array latch, the weights are updated with the calculated updates, and the updated weights are stored in a new NAND block using an off-chip read-modify-write operation (e.g. a read-modify-write using a separate DRAM) or a NAND-based on-chip copy with update. If, at decision block 708, the current iteration was not the last WL, processing returns to block 704 and block 706 to update weights for a next WL for the same layer. The procedure repeats for each of the WLs, then advances to the next layer. If, at decision block 710, the current layer is not the last layer, processing returns to blocks 704 and 706 for the next layer. Once all layers have been processed, a final output may be transferred to the SSD controller and then to a host block 712. The final output might be a value indicating a final trained output result.

Updating Synaptic Weights Using NAND-Based On-Chip Copy with Update Operation

Figure 8:
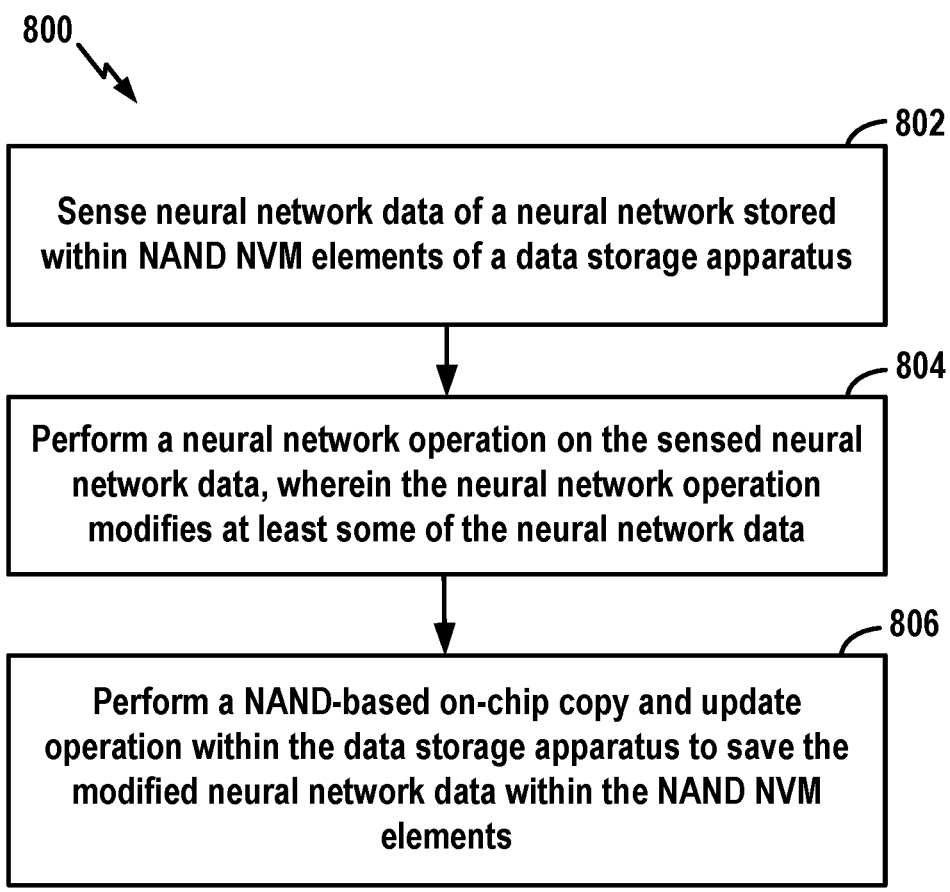
FIG. 8 illustrates a flow chart that summarizes exemplary NAND-based on-chip copy with update operations.

FIG. 8 summarizes NAND-based on-chip copy and update procedures 800 for use with NVM-based neural network operations. Briefly, at block 802, a data storage apparatus senses neural network data of a neural network (e.g. synaptic weights) stored within NAND NVM elements of the data storage apparatus (such as from a set of NAND storage elements). The synaptic weights may be read or sensed, for example, by under-the-array components of a NAND die, as explained above. At block 804, the data storage apparatus performs a neural network operation on the sensed neural network data, wherein the neural network operation modifies at least some of the neural network synaptic weight data. The neural network operation may be, for example, a backpropagation operation performed on synaptic weights stored in a set of NAND elements. At block 806, the data storage apparatus performs an NAND-based on-chip copy and update operation to save the modified neural network data within the NAND NVM elements. The NAND-based on-chip copy with update may use under-the-array circuit components (as shown in FIG. 2, discussed above).

As used herein, "NAND-based on-chip copy and update" or "NAND-based on-chip copy with update" or "weight-adapting on-chip copy" is a type of read-modify-write operation to update values stored in a NAND array where the read-modify-write is implemented without an off-chip component such as a DRAM. For example, a NAND die may be configured with a fixed number of blocks that run in SLC mode, while others run in TLC mode. When data is moved from the SLC to the TLC portion, the transfer is performed internally in the die, using the on-chip copy. Normally, an SLC to TLC transfer is performed like a wear-leveling operation by using the NAND interface (e.g., Toggle or ONFI) and an off-chip DRAM to move the data. Overhead can be reduced using NAND-based on-chip copy with update because the copy is done within the die and using volatile latches in the die to store temporarily the three pages. Since an SLC block is often exactly one third of a TLC block, three SLC blocks may be folded into one TLC block. Note that NAND-based on-chip copy with update need not always employ TLC. In some cases, other types of single or MLC blocks might be used or, as noted below, in some examples, SLC to SLC on-chip copy and update may be performed. Other functions that might be referred to in the literature as on-chip copy or on-chip read-modify-write, such as functions implemented in a cross-point Resistive RAM device (or a PCM device) that has inherently a write-in-place capability, are not NAND-based on-chip copy with update functions, as that term or similar terms are used herein.

In some particular examples of NAND-based on-chip copy and update, the die first reads weights from a first NAND block into a latch, modifies the weights according to a neural network backpropagation learning scheme in the latch, then writes updated weights from the latch to a new physical block that was previously erased, where the weight update is performed for the full block, and where flash management tables are updated accordingly.

Figure 9:
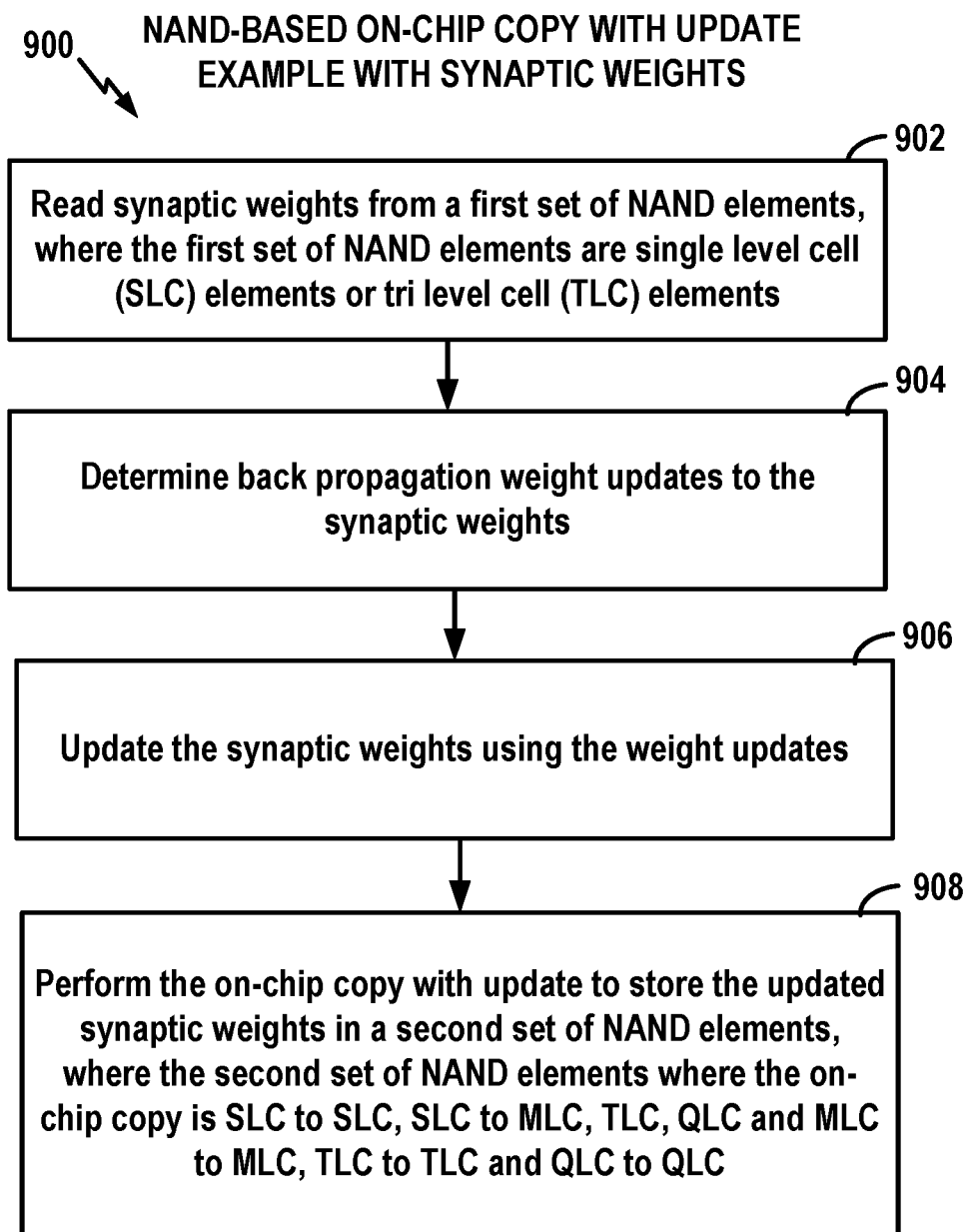
FIG. 9 illustrates a flow chart of exemplary NAND-based on-chip copy with update operations for use in updating synaptic weights.

FIG. 9 illustrates an exemplary NAND-based on-chip copy and update procedure 900 for use with backpropagation neural network operations. At block 902, synaptic weights are read from a first set of NAND elements, where the first set of NAND elements are SLC elements or TLC elements. The synaptic weights may be read or sensed, as noted, by under-the-array components of the NVM die. At block 904, backpropagation weight updates are determined to the synaptic weights by, for example, the above-described backpropagation components or circuits that compute values in accordance with Equations 5-8, above. At block 906, the synaptic weights are updated using the weight updates by, for example, replacing synaptic weights maintained in a latch with updated values. At block 908, an on-chip copy with update circuit performs an on-chip copy to store the updated synaptic weights in a second set of NAND elements, where the second set of NAND elements are SLC, MLC, TLC or QLC elements, and where the on-chip copy is SLC to SLC, SLC to MLC, TLC, QLC and MLC to MLC, TLC to TLC and/or QLC to QLC.

FTL Tables and Methods

As noted above, in some examples, a first FTL table maps a neural network weight unit to a virtual-block-ID, which corresponds to a physical location in the NAND die but identifies the physical location using a block-ID that is logical. (As also noted above, the virtual-block-ID may also have a corresponding a page-in-block identifier.) A second FTL table maps the virtual-block-ID to a physical-block-ID. With this arrangement, when updating the location of "weights" at the end of DLA operation, the FTL components of the controller need not search for "weight units" that were copied (by, e.g., scanning FTL tables, by reading the headers in the block, or by maintaining a reverse table, etc.). In addition, the FTL components need not update each "weight unit" separately but rather may just update a single entry in the second FTL table (which maps the association of the virtual-block-ID into a new physical-block-ID) so as to simplify the FTL and reduce overhead. Thus, the use of two FTL tables along with on-chip copy with update may be quite beneficial for the NAND array (because, e.g., many flash management background operations can be minimized or reduced).

Figure 10:
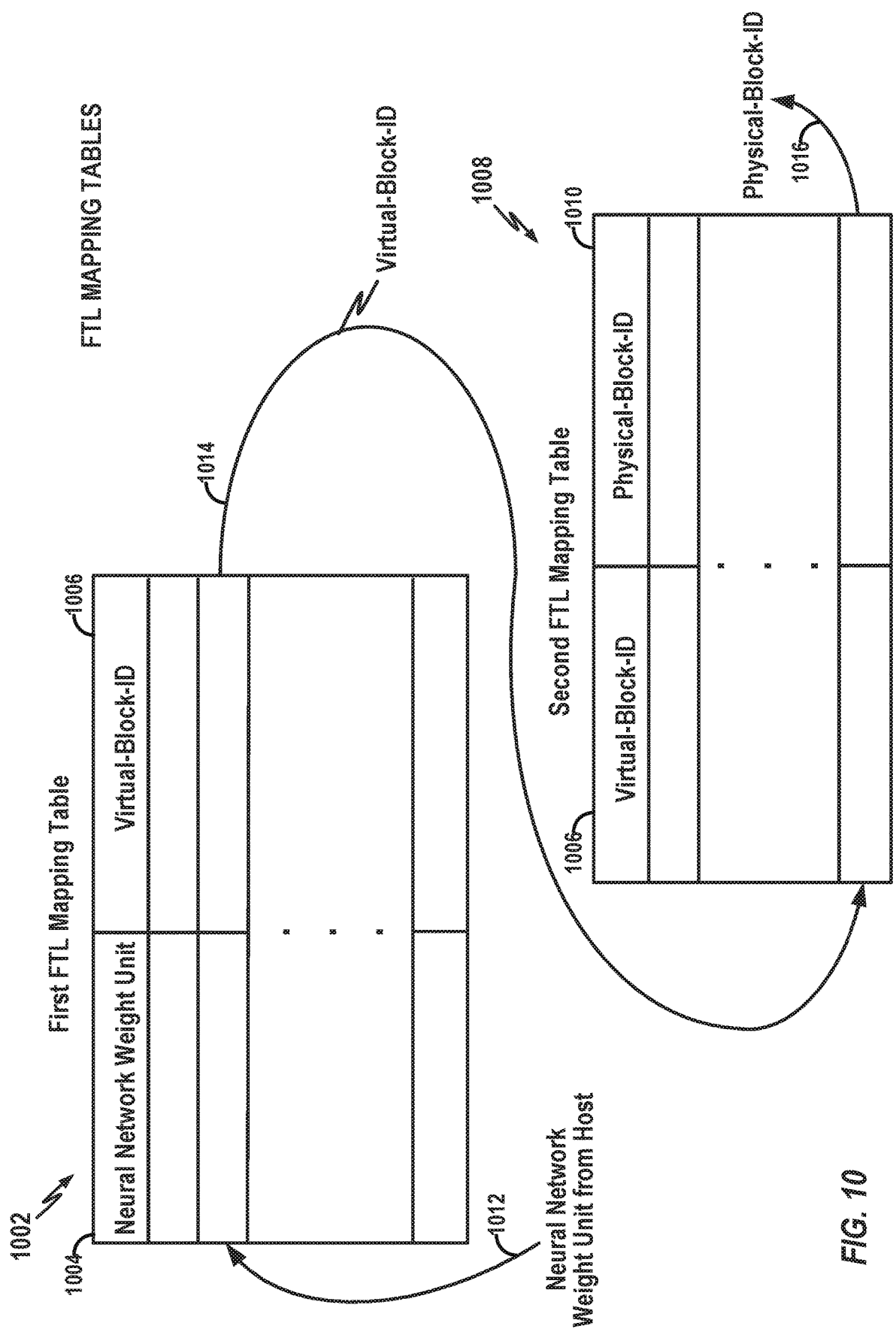
FIG. 10 illustrates exemplary first and second flash translation layer (FTL) mapping tables for use within a controller of an NVM die that stores synaptic weights.

FIG. 10 illustrates exemplary first and second FTL mapping tables. A first (or primary) FTL mapping table 1002 includes a set of entries each of which includes a host neural network weight unit 1004 and a corresponding virtual-block-ID 1006. A second (or secondary) FTL mapping table 1008 includes a set of entries each of which includes one of the virtual-block-ID's 1006 and a corresponding physical-block-ID 1020. In the example of FIG. 10, an input host neural network weight unit 1012 is applied to the first FTL mapping table 1002 to output a particular virtual-block-ID 1014, which is applied to the second FTL mapping table 1008 to output a corresponding particular physical-block-ID 1016.

Figure 11:
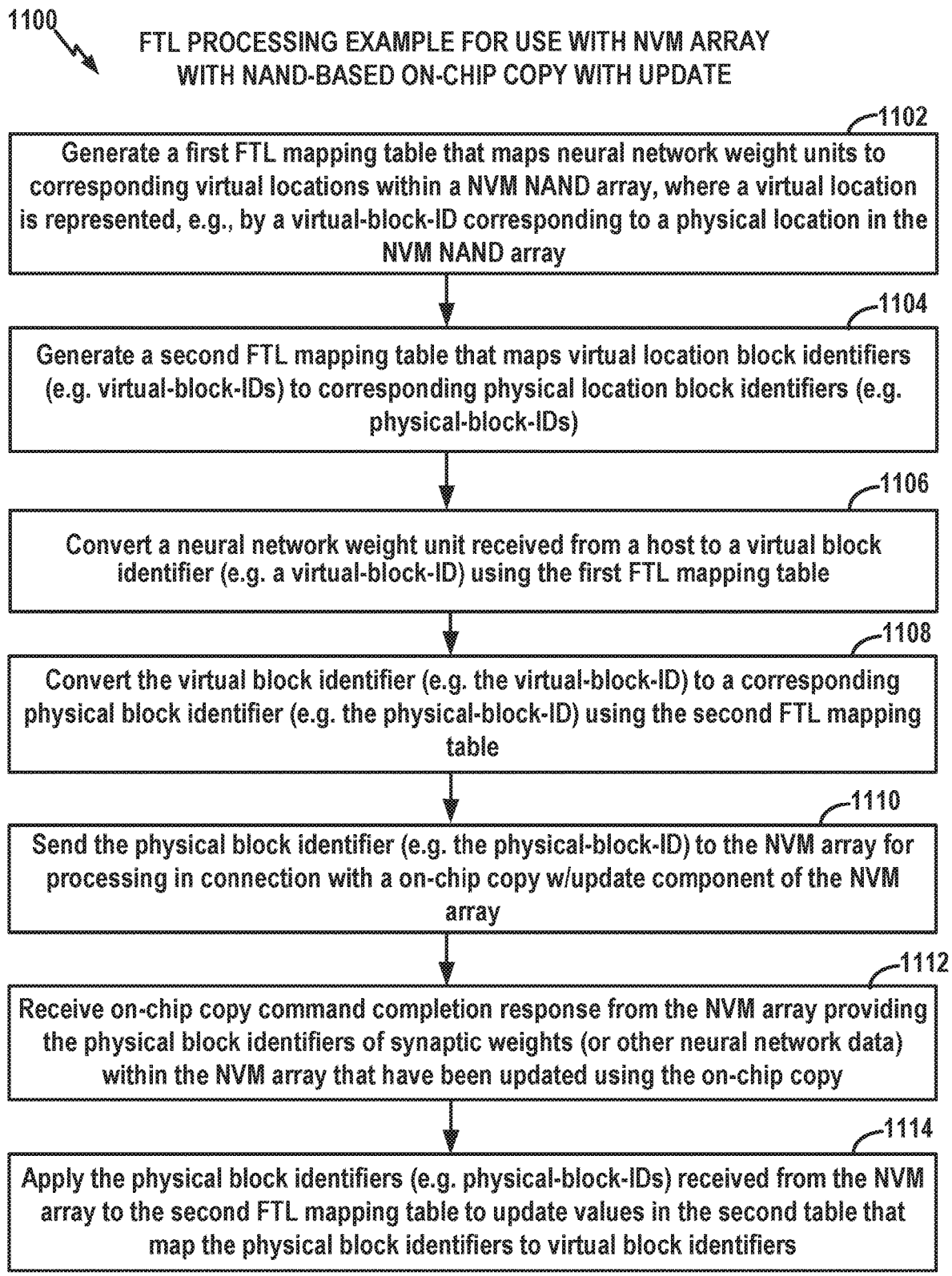
FIG. 11 illustrates a flow chart of exemplary FTL processing performed by a controller that uses first and second FTL mapping tables.

FIG. 11 provides an example 1100 of processing performed by an SSD controller (or similar apparatus) equipped with the FTL tables of FIG. 10 for use with an NVM array that uses NAND-based on-chip copy w/update to update synaptic weights for backpropagation. At block 1102, the controller generates a first FTL mapping table that maps neural network weight units to corresponding virtual locations within a NVM NAND array, where a virtual location is represented, for example, by a virtual-block-ID corresponding to a physical location in the NVM NAND array. At block 1104, the controller generates a second FTL mapping table that maps virtual location block identifiers (e.g. virtual-block-IDs) to corresponding physical location block identifiers (e.g. physical-block-IDs). At block 1106, the controller converts a neural network weight unit received from a host (coupled to the controller) to a virtual block identifier (e.g. a virtual-block-ID) using the first FTL mapping table. At block 1108, the controller converts the virtual block identifier (e.g. the virtual-block-ID) to a corresponding virtual block identifier (e.g. the physical-block-ID) using the second FTL mapping table. At block 1110, the controller sends the physical block identifier (e.g. the physical-block-ID) to the NVM array for processing in connection with an on-chip copy component of the NVM array, such as for use with the updating of synaptic weights using on-chip copy w/update during backpropagation. At block 1112, the controller receives an on-chip copy command completion response from the NVM array providing the physical block identifiers (e.g. physical-block-ID) of synaptic weights (or other neural network data) within the NVM array that have been updated using the on-chip copy w/update feature. At block 1114, the controller applies the physical block identifiers (e.g. physical-block-ID) received from the NVM array to the second FTL mapping table to update values in the second table that map the physical block identifiers to virtual block identifiers.

In the following, various general exemplary procedures and systems are described.

Example Processes or Procedures

Figure 12:
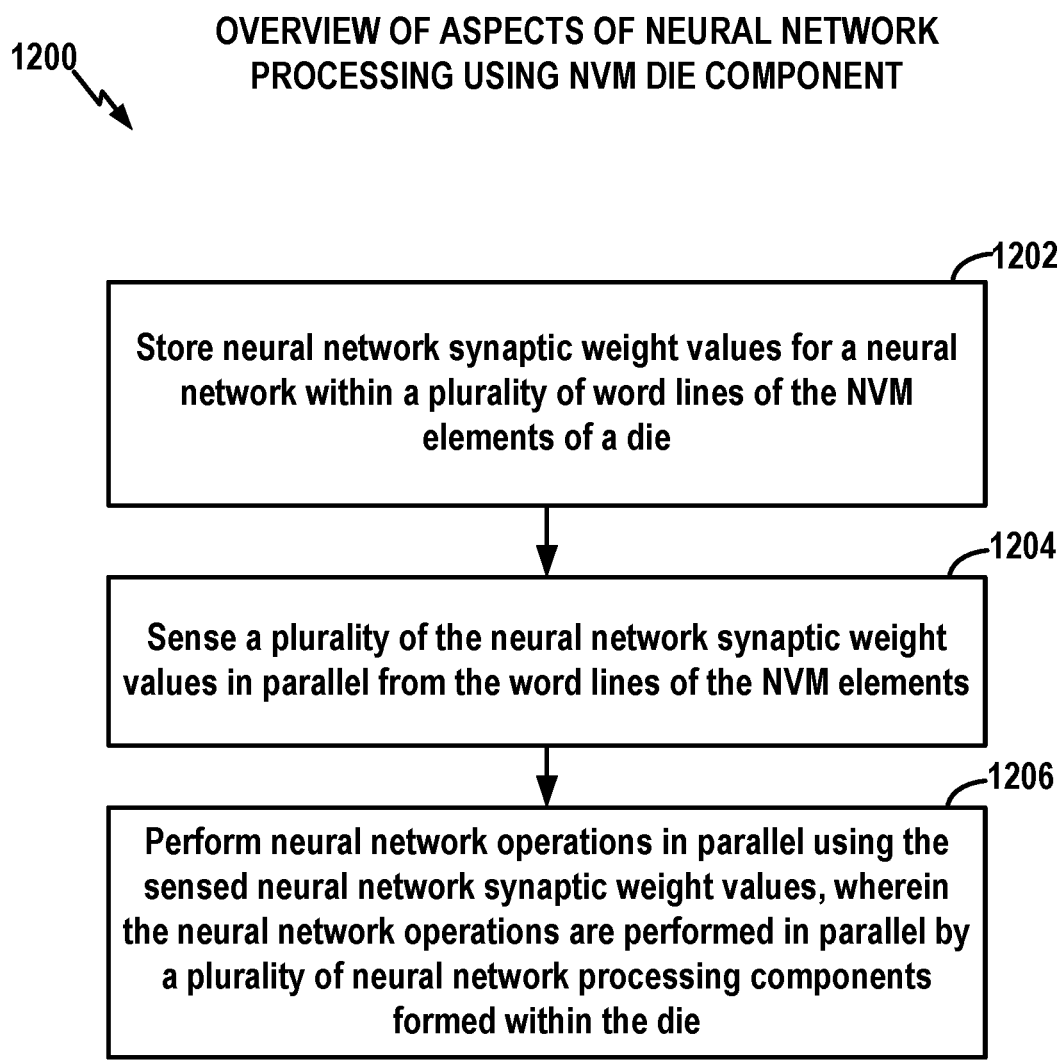
FIG. 12 illustrates a flow chart that summarizes exemplary neural network operations performed by an NVM die.

FIG. 12 illustrates a process 1200 in accordance with some aspects of the disclosure. The process 1200 may take place within any suitable apparatus or device capable of performing the operations, such as a NAND die of an NVM array. At block 1202, the memory apparatus (e.g. a NAND die) stores neural network synaptic weight values for a neural network within a plurality of word lines of the NVM elements of a die. At block 1204, the apparatus senses a plurality of the synaptic weight neural network values in parallel from the word lines of the NVM elements. At block 1206, the apparatus performs neural network operations in parallel using the sensed neural network synaptic weight values, wherein the neural network operations are performed in parallel by a plurality of neural network processing components formed within the die. As already explained, the neural network processing components may include one or more circuits formed under-the-array or next-to-the-array within a NAND die. The synaptic weight values may be stored vertically on separate or different word lines (such as within a 3D NAND). The neural network processing components may include, e.g., a set of MAC circuits that operate in parallel. And, as also already explained, neural network operations may include feedforward operations or backpropagation operations and may exploit various other types of additional neural network data such as activation values, bias values, etc.

Figure 13:
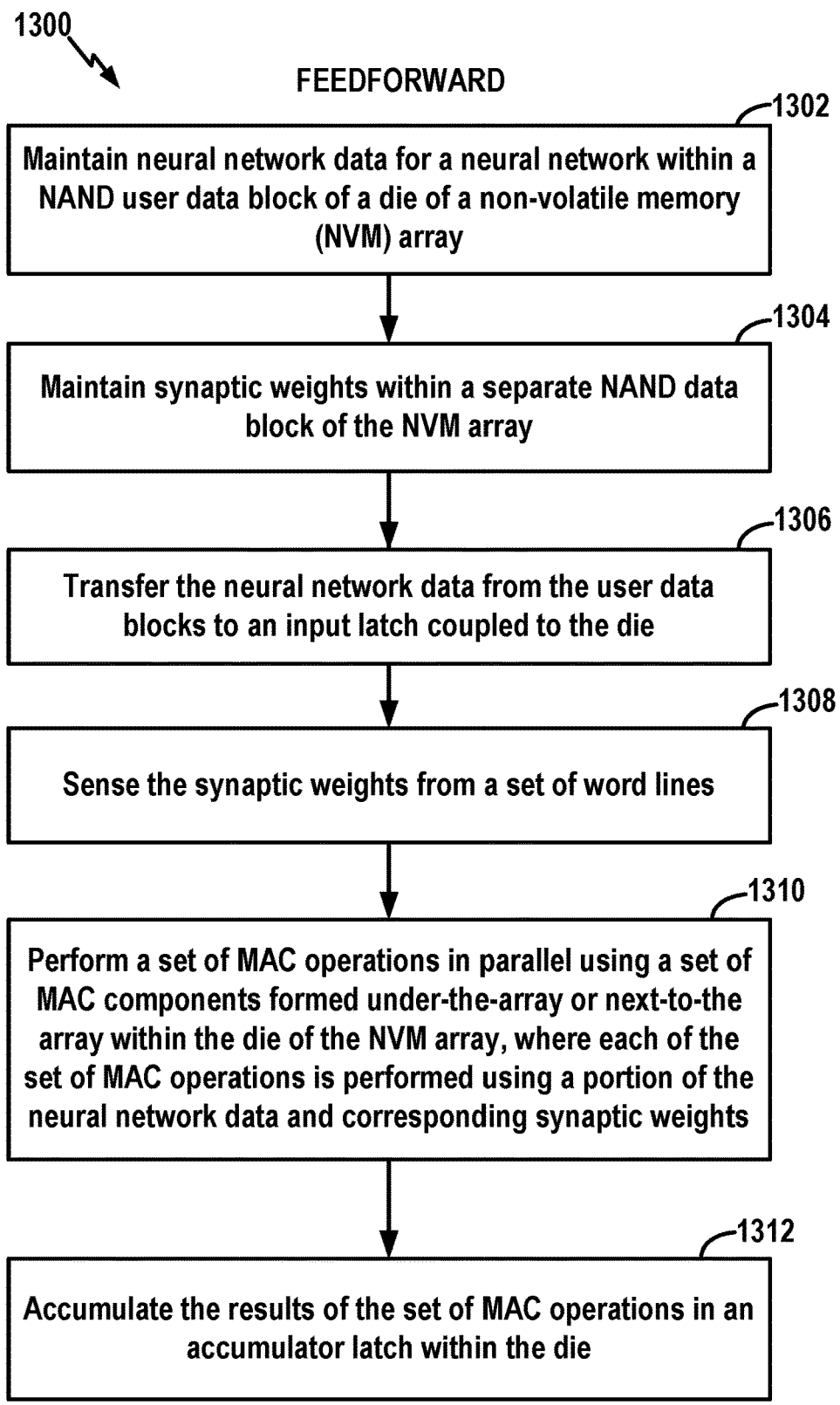
FIG. 13 illustrates a flow chart of exemplary feedforward neural network operations performed by an NVM die using under-the-array or next-to-the-array circuit components.

FIG. 13 illustrates a process 1300 in accordance with other aspects of the disclosure. The process 1300 may take place within any suitable apparatus or device capable of performing the operations, such as a NAND die of an NVM array. At block 1302, an apparatus (e.g. a NAND die) maintains neural network data for a neural network within a NAND user data block of a die of the NVM array. At block 1304, the apparatus maintains synaptic weights within a separate NAND data block of the NVM array. At block 1306, the apparatus transfers the neural network data from the user data blocks to an input latch coupled to the die. At block 1308, the apparatus senses the synaptic weights from a set of word lines. At block 1310, the apparatus performs a set of MAC operations in parallel using a set of MAC components formed under-the-array or next-to-the array within the die of the NVM array, where each of the set of MAC operations is performed using a portion of the neural network data and corresponding synaptic weights. At block 1312, the apparatus accumulates the results of the set of MAC operations in an accumulator latch within the die. Examples were described above.

Figure 14:
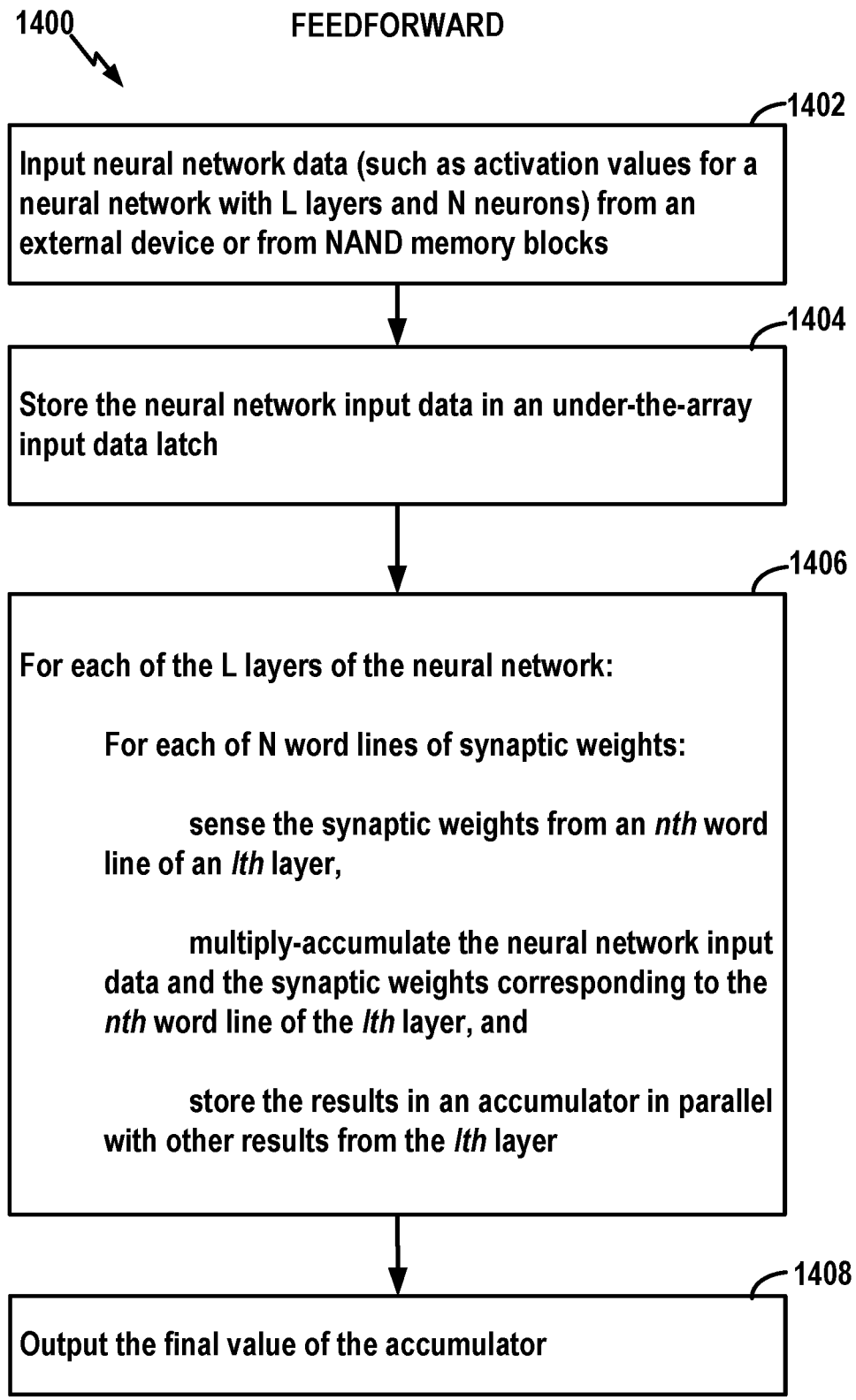
FIG. 14 illustrates a flow chart of additional exemplary feedforward neural network operations performed by an NVM die.

FIG. 14 illustrates a feedforward process 1400 in accordance with still other aspects of the disclosure. The process 1400 may take place within any suitable apparatus or device capable of performing the operations, such as a NAND die of an NVM array. At 1402, the apparatus inputs neural network data (such as activation values for a neural network with L layers and N neurons) from an external device or from NAND memory blocks. At 1404, the apparatus stores the neural network input data in an under-the-array input data latch. At 1406, the apparatus, for each of the L layers of the neural network, and for each of N word lines of synaptic weights, the apparatus senses the synaptic weights from an nth word line of an lth layer, multiply-accumulates the neural network input data and the synaptic weights corresponding to the nth word line of the lth layer, and stores the results in an accumulator in parallel with other results from the lth layer. At 1408, the apparatus outputs the final value of the accumulator to, for example, an SSD controller for forwarding to a host device.

Figure 15:
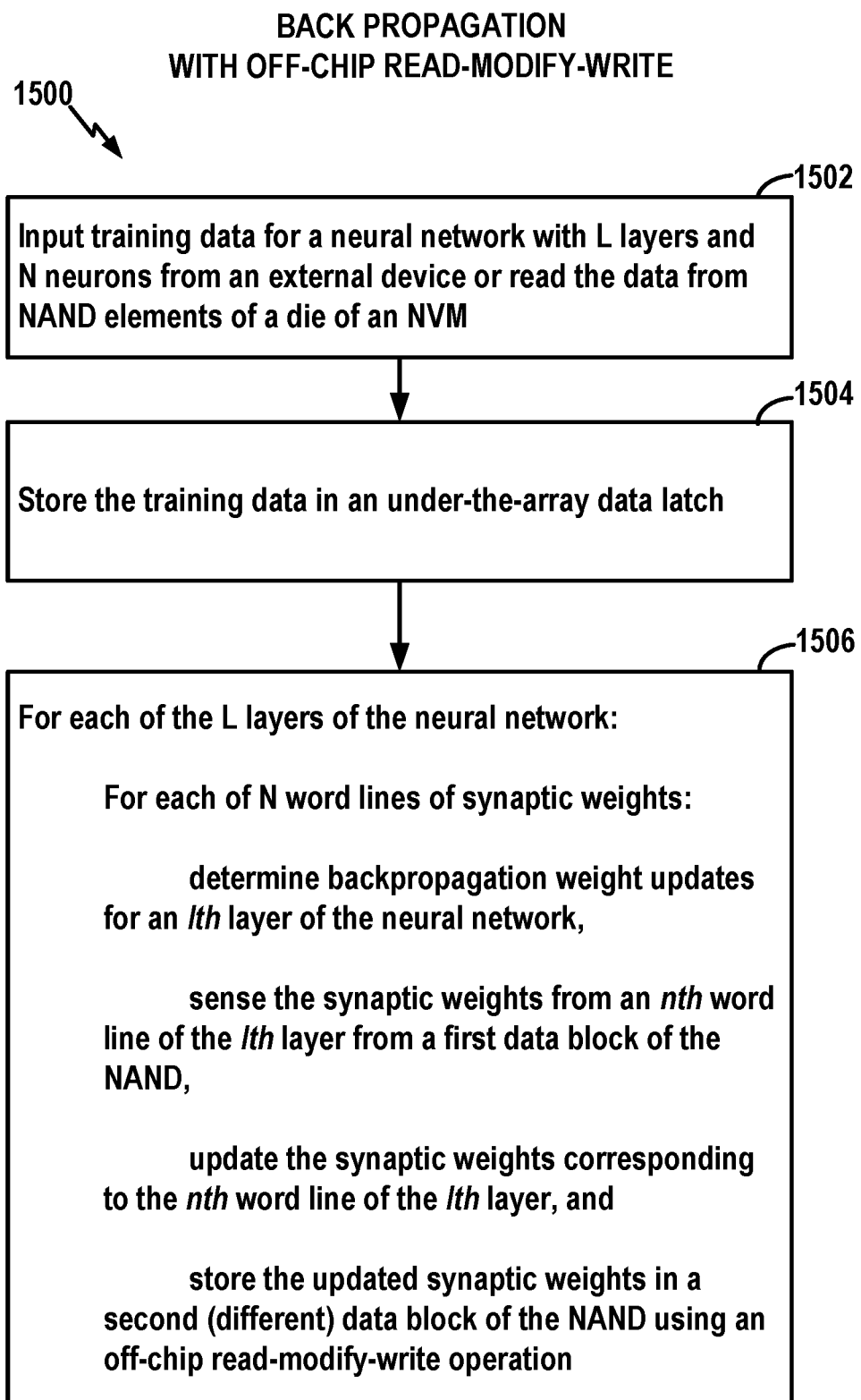
FIG. 15 illustrates a flow chart of exemplary backpropagation neural network operations performed by an NVM die that uses an off-chip read-modify-write to update synaptic weights.

FIG. 15 illustrates a backpropagation process 1500 in accordance with still other aspects of the disclosure that employs an off-chip read-modify-write. The process 1500 may take place within any suitable apparatus or device capable of performing the operations, such as a NAND die of an NVM array. At 1502, the apparatus inputs training data for a neural network with L layers and N neurons from an external device or reads the data from NAND elements of the die. At 1504, the apparatus stores the training data in an under-the-array data latch. At 1506, the apparatus, for each of the L layers of the neural network, and for each of N word lines of synaptic weights, determines backpropagation weight updates for an lth layer of the neural network, senses the synaptic weights from an nth word line of the lth layer from a first data block of the NAND, updates the synaptic weights corresponding to the nth word line of the lth layer, and stores the updated synaptic weights in a second (different) data block of the NAND using an off-chip read-modify-write operation, i.e. a read-modify-write that employs a device external to the chip, such as a DRAM, to facilitate the read-modify-write.

Figure 16:
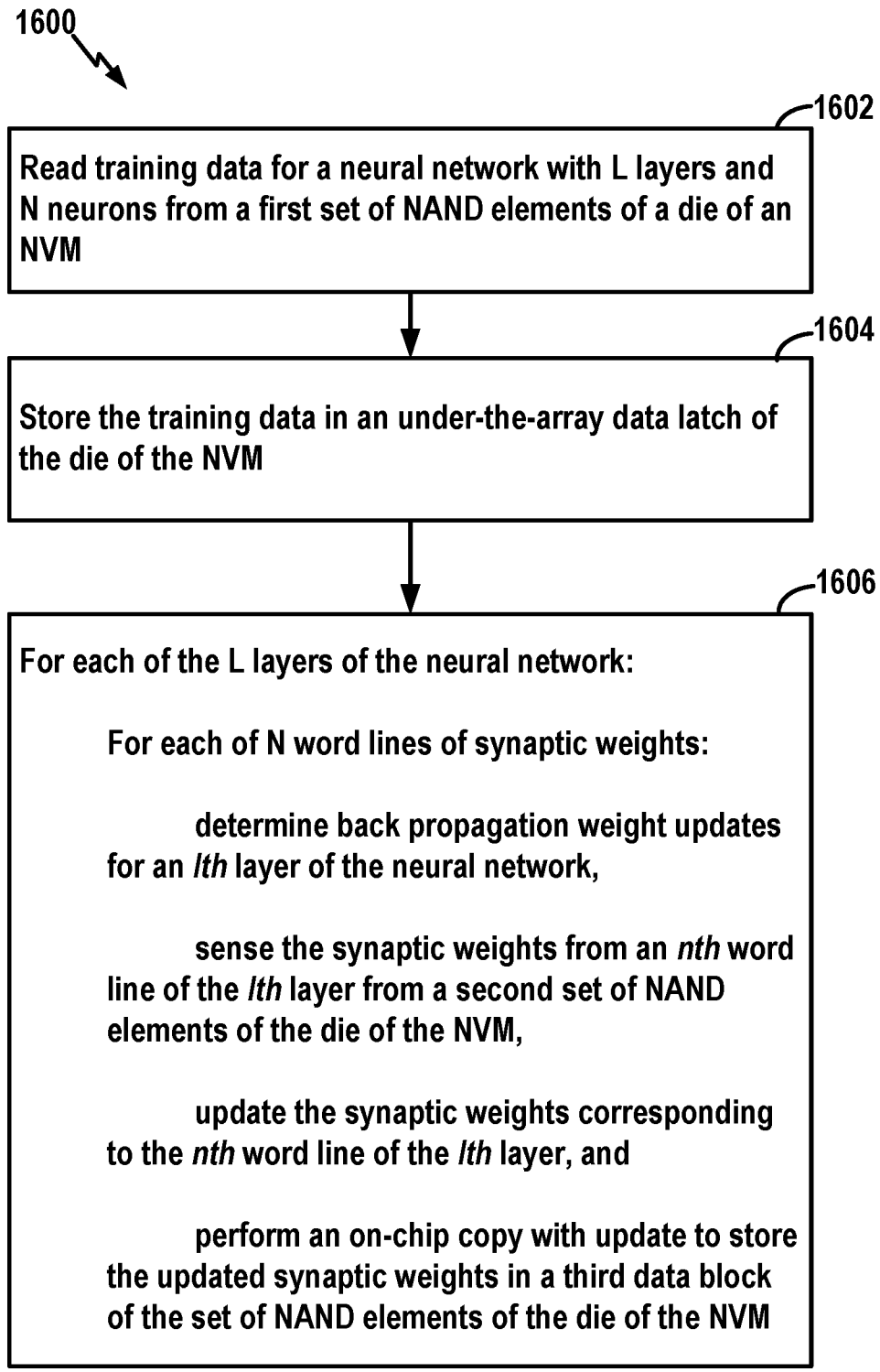
FIG. 16 illustrates a flow chart of exemplary backpropagation neural network operations performed by an NVM die that uses an NAND-based on-chip copy to update synaptic weights.

FIG. 16 illustrates a backpropagation process 1600 in accordance with still other aspects of the disclosure that employs an on-chip copy with update. The process 1600 may take place within any suitable apparatus or device capable of performing the operations, such as a NAND die of an NVM array. At 1602, the apparatus reads training data for a neural network with L layers and N neurons from a first set of NAND elements of a die of an NVM. At 1604, the apparatus stores the training data in an under-the-array data latch. At 1606, the apparatus, for each of the L layers of the neural network, and for each of N word lines of synaptic weights, determines backpropagation weight updates for an lth layer of the neural network, senses the synaptic weights from an nth word line of the lth layer from a second set of NAND elements of the die of the NVM, updates the synaptic weights corresponding to the nth word line of the lth layer, and performs an on-chip copy with update to store the updated synaptic weights in a third data block of the set of NAND elements of the die of the NVM.

Figure 17:
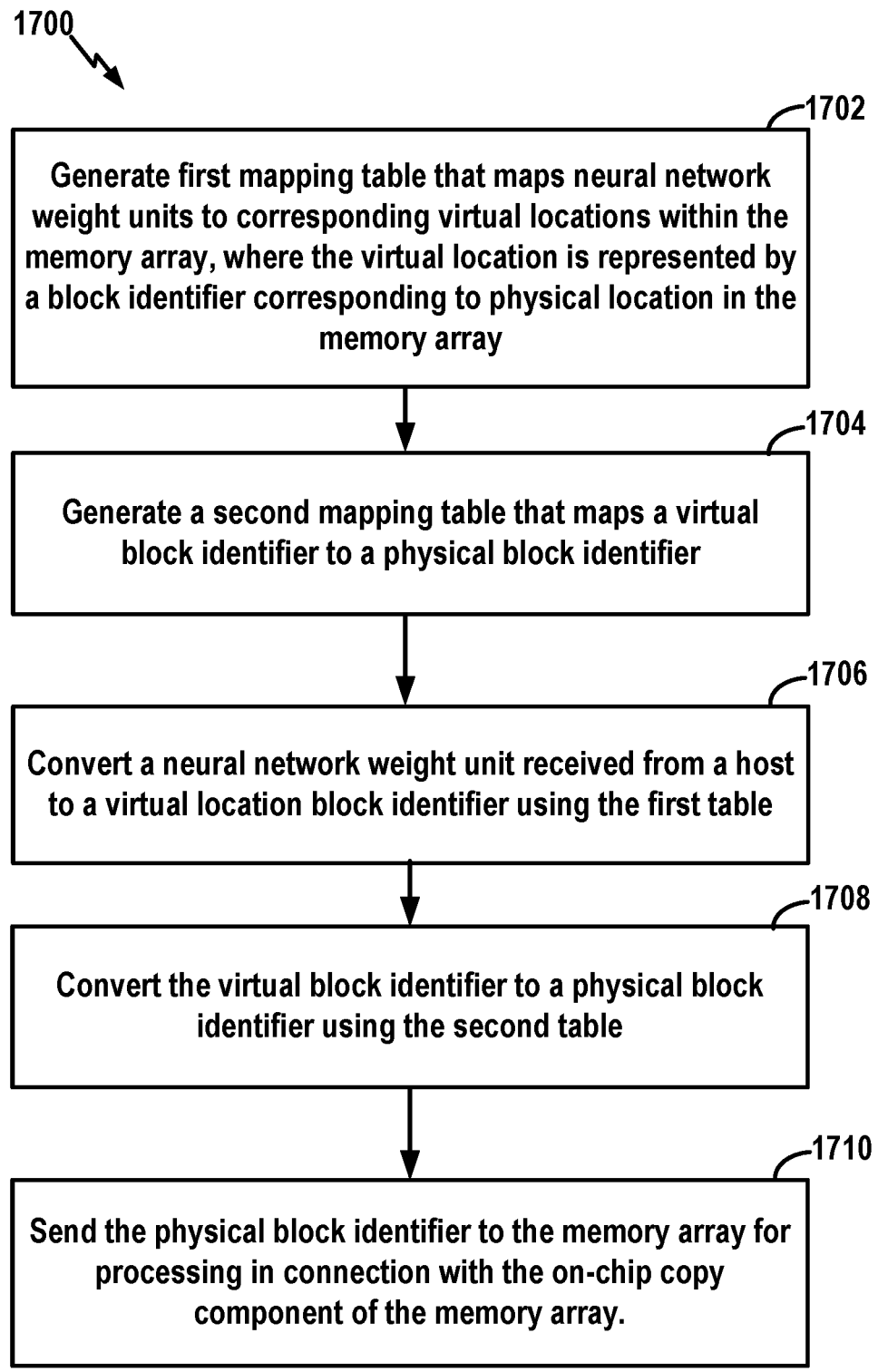
FIG. 17 illustrates a flow chart of exemplary mapping table operations performed by a controller that uses first and second mapping tables.

FIG. 17 illustrates a process 1700 in accordance with still other aspects of the disclosure. The process 1700 may take place within any suitable apparatus or device capable of performing the operations, such as the SSD controller for use with an NVM array having one or more NAND dies equipped with on-chip copy with update. At block 1702, an apparatus (e.g. a controller) generates a first mapping table that maps neural network weight units to corresponding virtual locations within the memory array, where the virtual location is represented by a block identifier corresponding to physical location in the memory array. At 1704, the apparatus generates a second mapping table that maps a virtual location block identifier to a physical location block identifier. At 1706, the apparatus converts a neural network weight unit received from a host to a virtual location block identifier using the first table. At 1708, the apparatus converts the virtual location block identifier to a physical location block identifier using the second table. At 1710, the apparatus sends the physical location block identifier(s) to the memory array for processing in connection with the on-chip copy with update component of the memory array.

Exemplary Apparatus

Figure 18:
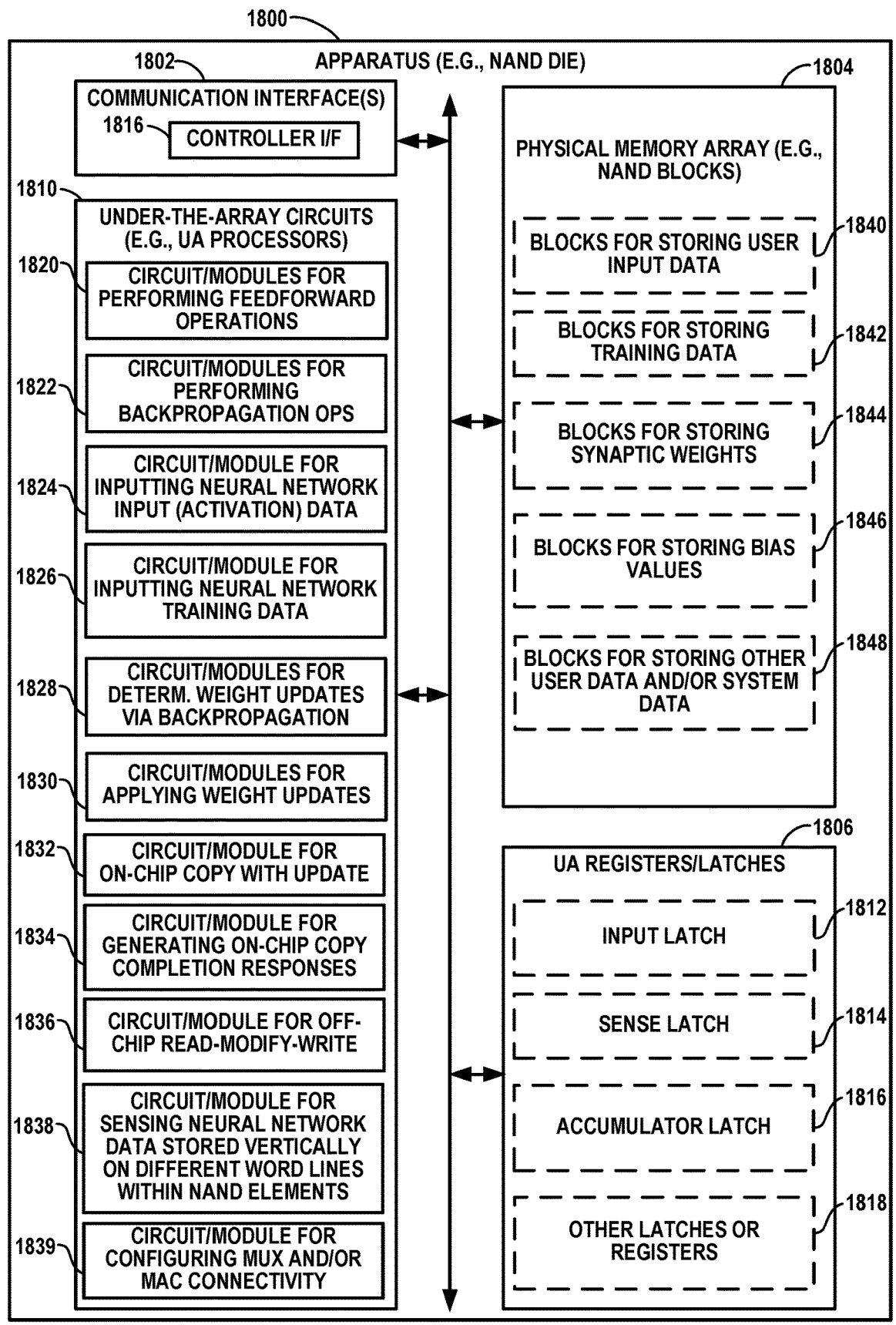
FIG. 18 illustrates a schematic block diagram configuration for an exemplary NVM apparatus such as a NAND die.

FIG. 18 illustrates an embodiment of an apparatus 1800 configured according to one or more aspects of the disclosure. The apparatus 1800, or components thereof, could embody or be implemented within a NAND die or some other type of NVM device that supports data storage. In various implementations, the apparatus 1800, or components thereof, could be a component of a processor, a controller, a computing device, a personal computer, a portable device, or workstation, a server, a personal digital assistant, a digital camera, a digital phone, an entertainment device, a medical device, a self-driving vehicle control device, or any other electronic device that stores, processes or uses neural data.

The apparatus 1800 includes a communication interface 1802, a physical memory array (e.g., NAND blocks) 1804, a set or UA registers and/or latches 1806, and a set of under-the-array or next-to-the-array processing circuits 1810 (e.g., at least one UA processor and/or other suitable UA circuitry). These components can be coupled to and/or placed in electrical communication with one another via suitable components, represented generally by the connection lines in FIG. 18. Although not shown, other circuits such as timing sources, peripherals, voltage regulators, and power management circuits may be provided, which are well known in the art, and therefore, will not be described any further.

The communication interface 1802 provides a means for communicating with other apparatuses over a transmission medium. In some implementations, the communication interface 1802 includes circuitry and/or programming (e.g., a program) adapted to facilitate the communication of information bi-directionally with respect to one or more devices in a system. In some implementations, the communication interface 1802 may be configured for wire-based communication. For example, the communication interface 1802 could be a bus interface, a send/receive interface, or some other type of signal interface including circuitry for outputting and/or obtaining signals (e.g., outputting signal from and/or receiving signals into an SSD). The communication interface 1802 serves as one example of a means for receiving and/or a means for transmitting.

The physical memory array 1804 may represent one or more NAND blocks. The physical memory array 1804 may be used for storing data such as synaptic weights that is manipulated by the UA circuits 1810 or some other component of the apparatus 1800. The physical memory array 1804 may be coupled to the UA circuits 1810 (via, e.g., registers/latches 1806) such that the UA circuits 1810 can read or sense information from, and write or program information to, the physical memory array 1804 (via, e.g., registers/latches 1806). That is, the physical memory array 1804 can be coupled to the UA circuits 1810 so that the physical memory array 1804 is accessible by the UA circuits 1810.

The UA registers/latches 1806 may include one or more of: an input latch 1812; a sensing latch 1814; an accumulator latch 1816; and one or more other latches or registers 1818. As noted, in some examples, the input latch might be separate from the NAND die.

The UA circuits 1810 are arranged or configured to obtain, process and/or send data, control data access and storage, issue or respond to commands, and control other desired operations. For example, the UA circuits 1810 may be implemented as one or more processors, one or more controllers, and/or other structures configured to perform functions.

According to one or more aspects of the disclosure, the UA circuits 1810 may be adapted to perform any or all of the under-the-array features, processes, functions, operations and/or routines described herein. For example, the UA circuits 1810 may be configured to perform any of the steps, functions, and/or processes described with respect to FIGS. 2-9 and 12-16. As used herein, the term "adapted" in relation to the processing circuit 1810 may refer to the UA circuits 1810 being one or more of configured, employed, implemented, and/or programmed to perform a particular process, function, operation and/or routine according to various features described herein. The UA circuits 1810 may include a specialized processor, such as an application specific integrated circuit (ASIC) that serves as a means for (e.g., structure for) carrying out any one of the operations described in conjunction with FIGS. 2-9 and 12-16. The UA circuits 1810 serves as one example of a means for processing. In various implementations, the UA circuits 1810 may provide and/or incorporate, at least in part, the functionality described above for the UA components 204 of FIG. 2.

According to at least one example of the apparatus 1800, the processing circuit 1810 may include one or more of: circuit/modules 1820 configured to perform feedforward operations in parallel; circuit/modules 1822 configured to perform backpropagation operations in parallel; a circuit/module 1824 configured to input neural network input (e.g. activation) data; a circuit/module 1826 configured to input neural network training data (e.g. desired or known output values); circuit/modules 1828 configured to determine weight updates via backpropagation in parallel; circuit/modules 1830 configured to apply weight updates in parallel to weights stored in the physical memory array 1804; a circuit/module 1832 configured to perform an on-chip copy with update; and a circuit/module 1834 configured to generate on-chip copy completion responses for sending to an SSD controller (so that, for example, the SSD controller can updated FTL tables or the like; and a circuit/module 1836 configured to perform an off-chip read-modify-write operations (in conjunction with an external device such as an SSD controller). It is noted that in some examples on-chip copy and off-chip read-modify-write (in conjunction with an external device) might not both be provided. Rather, in some examples, one or the other might be implemented. In other examples, both might be used. The processing circuit 1810 may also include a circuit module 1838 configured to sense neural network data (such as synaptic weights) stored vertically on different or separate word lines within the NAND NVM elements. Still further, the processing circuit 1810 may include a circuit module 1839 for configuring MUX and/or MAC connectivity.

As shown in FIG. 18, the physical memory array 1804 may include one or more of: blocks 1840 for storing user input data; blocks 1842 for storing training data; blocks 1844 for storing synaptic weights; blocks 1846 for storing bias values; and blocks 1848 for storing other user data and/or system data (e.g. data pertaining to the overall control of operations of the NAND die).

In at least some examples, means may be provided for performing the functions illustrated in FIG. 18 and/or other functions illustrated or described herein. For example, the means may include one or more of: means, such as circuit/module 1820, for performing feedforward operations; means, such as circuit/module 1822, for performing backpropagation operations; means, such as circuit/module/component 1824, for inputting neural network input (e.g. activation) data; means, such as circuit/module 1826, for inputting neural network training data (e.g. desired or known output values); means, such as circuit/module 1828, determining weight updates via backpropagation; means, such as circuit/module 1830, for applying weight updates to weights stored in a physical memory array; means, such as circuit/module 1832, for performing an on-chip copy with update; means, such as circuit/module 1834, for generating on-chip copy completion responses for sending to an external device such as ab SSD controller (so that, for example, the SSD controller can updated FTL tables or the like; means, such as circuit/module 1836, for performing an off-chip read-modify-write operation (in conjunction with an external device such as an SSD controller); means such as circuit module 1838, for sensing neural network data (such as synaptic weights) stored vertically on different or separate word lines within the NAND NVM elements; means, such as circuit module 1839, for configuring MUX and/or MAC connectivity; means, such as storage block 1840, for storing user input data; means, such as storage block 1842, for storing training data; means, such as storage block 1844, for storing synaptic weights; means, such as storage block 1846 for storing bias values; means, such as storage block 1848, for storing other user data and/or system data (e.g. data pertaining to the overall control of operations of the die); means, such as latch 1812, for latching input data; means, such as latch 1814, for latching sensed data; and means, such as latch 1816, for accumulating data or results. Still further, the means may include one or more of: means, such as input latch 1812, for inputting neural network input data; means, such as NAND blocks 1844, for storing synaptic weights for a neural network within NVM elements of a die; and means, such as UA components 204 of FIG. 4, for performing a neural network operation using the neural network input data and the synaptic weights, wherein the neural network operation is performed, at least in part, by a neural network processing component formed within the die.

In other examples, means, such as UA processors 1810, are provided for performing a neural network operation using the neural network data, wherein the neural network operation is performed, at least in part, by a neural network processing component formed within the die of the data storage apparatus. In still other examples, the means may include: means, such as NAND block 400 of FIG. 4, for storing neural network synaptic weight values for a neural network within a plurality of word lines of the NVM elements; means, such as latch 316 of FIG. 4, for sensing a plurality of the neural network synaptic weight values in parallel from the word lines of the NVM elements; and means, such as MACs 312 of FIG. 3, for performing neural network operations in parallel using the sensed neural network synaptic weight values, wherein the neural network operations are performed in parallel by a plurality of neural network processing components formed within the die.

In still yet other examples, the means may include: means, such as wordlines 402 of FIG. 4, for storing neural network synaptic weight values for a neural network within NVM elements of a die of the apparatus, where the synaptic weight values are within the NVM elements of the die within a plurality of word lines; means, such as sense latch 316 of FIG. 3, for accessing synaptic weight values in parallel from the word lines using synaptic weight value access components (e.g. the sense latch 316) formed within the die; means, such as input latch 305 of FIG. 3, for inputting neural network input data; and means, such as UA components 204 of FIG. 2, for performing neural network operations in parallel using the neural network input data and the synaptic weight values accessed by the means for accessing, wherein the means for performing the neural network operations in parallel comprises a plurality of neural network processing components formed within the die (such as MACs 312 of FIG. 2). In yet other examples, the means may include: means, such as circuits 1820 and 1822, for performing a neural network operation on the sensed neural network data, wherein the neural network operation modifies at least some of the neural network data; means, such as feedforward components 210 of FIG. 2, for performing feedforward neural network operations in parallel; and means, such as backpropagation components 220 of FIG. 2, for performing backpropagation neural network operations in parallel. The NVM elements may be NAND elements and the means for storing the neural network synaptic weight values may operate to store the synaptic weight values vertically on separate word lines in the NAND elements in the die, as already described.

Figure 19:
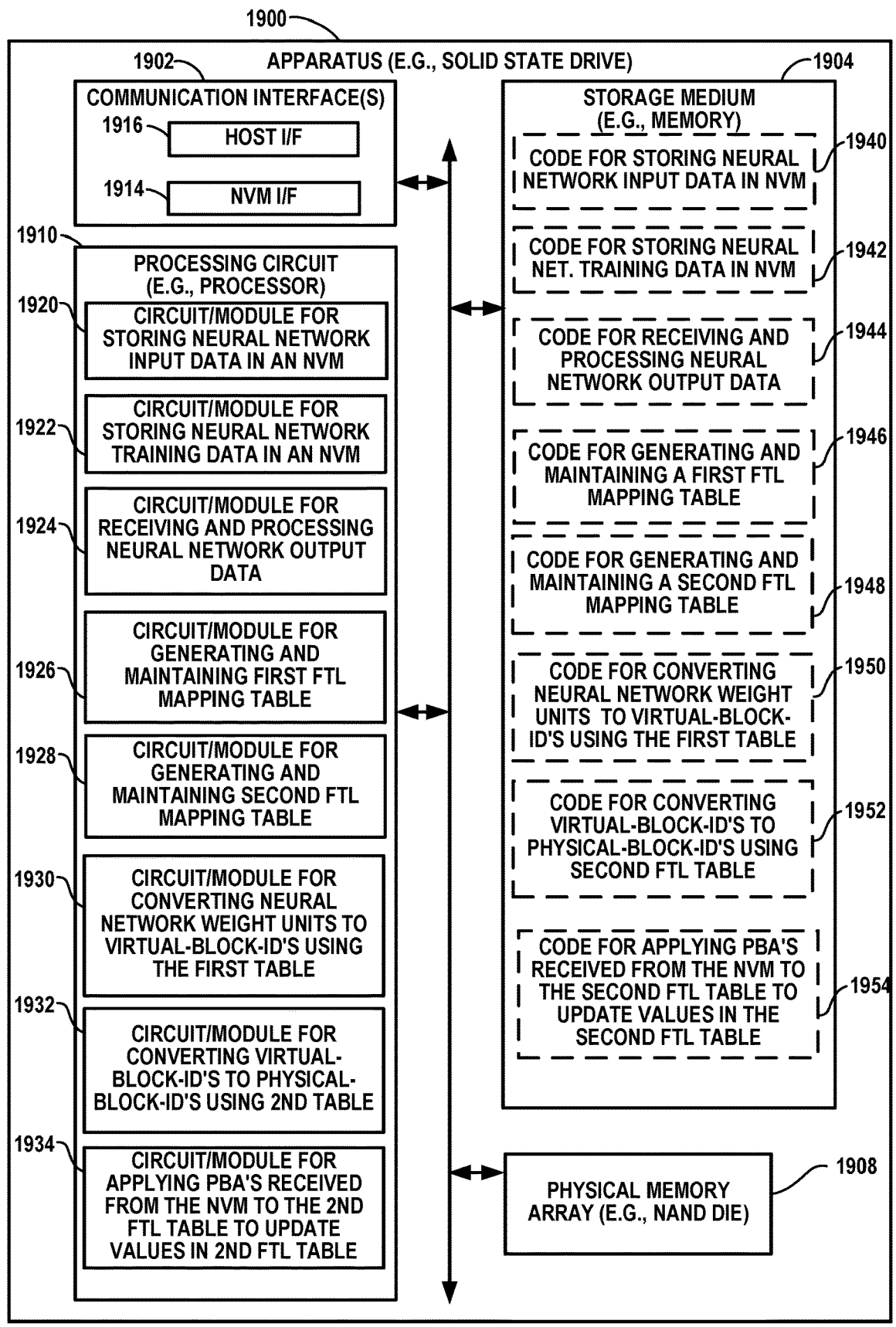
FIG. 19 illustrates a schematic block diagram configuration for an exemplary data storage apparatus such as an SSD having a controller and a NAND die.

FIG. 19 illustrates an embodiment of an apparatus 1900 configured according to one or more other aspects of the disclosure. The apparatus 1900, or components thereof, could embody or be implemented within a processor, a controller, an SSD controller, a host device, or some other type of device that processes data or controls data storage. In various implementations, the apparatus 1900, or components thereof, could embody or be implemented within a computing device, a personal computer, a portable device, or workstation, a server, a personal digital assistant, a digital camera, a digital phone, an entertainment device, a medical device, a self-driving vehicle control device, or any other electronic device that stores neural data.

The apparatus 1900 includes a communication interface 1902, a storage medium 1904, a memory array (e.g., an NVM memory circuit) 1908, and a processing circuit 1910 (e.g., at least one processor and/or other suitable circuitry). These components can be coupled to and/or placed in electrical communication with one another via a signaling bus or other suitable component, represented generally by the connection lines in FIG. 19. The signaling bus may include any number of interconnecting buses and bridges depending on the specific application of the processing circuit 1910 and the overall design constraints. The signaling bus links together various circuits such that each of the communication interface 1902, the storage medium 1904, and the memory array 1908 are coupled to and/or in electrical communication with the processing circuit 1910. The signaling bus may also link various other circuits (not shown) such as timing sources, peripherals, voltage regulators, and power management circuits, which are well known in the art, and therefore, will not be described any further.

The communication interface 1902 provides a means for communicating with other apparatuses over a transmission medium. In some implementations, the communication interface 1902 includes circuitry and/or programming (e.g., a program) adapted to facilitate the communication of information bi-directionally with respect to one or more devices in a system. In some implementations, the communication interface 1902 may be configured for wire-based communication. For example, the communication interface 1902 could be a bus interface, a send/receive interface, or some other type of signal interface including drivers, buffers, or other circuitry for outputting and/or obtaining signals (e.g., outputting signal from and/or receiving signals into an integrated circuit). The communication interface 1902 serves as one example of a means for receiving and/or a means for transmitting.

The memory array 1908 may represent one or more memory devices such as a NAND die. In some implementations, the memory array 1908 and the storage medium 1904 are implemented as a common memory component. The memory array 1908 may be used for storing data that is manipulated by the processing circuit 1910 or some other component of the apparatus 1900.

The storage medium 1904 may represent one or more computer-readable, machine-readable, and/or processor-readable devices for storing programming, such as processor executable code or instructions (e.g., software, firmware), electronic data, databases, or other digital information. The storage medium 1904 may also be used for storing data that is manipulated by the processing circuit 1910 when executing programming. The storage medium 1904 may be any available media that can be accessed by a general purpose or special purpose processor, including portable or fixed storage devices, optical storage devices, and various other mediums capable of storing, containing or carrying programming.

By way of example and not limitation, the storage medium 1904 may include a magnetic storage device (e.g., hard disk, floppy disk, magnetic strip), an optical disk (e.g., a compact disc (CD) or a digital versatile disc (DVD)), a smart card, a flash memory device (e.g., a card, a stick, or a key drive), a RAM, ROM, PROM, EPROM, an EEPROM, ReRAM, a register, a removable disk, and any other suitable medium for storing software and/or instructions that may be accessed and read by a computer. The storage medium 1904 may be embodied in an article of manufacture (e.g., a computer program product). By way of example, a computer program product may include a computer-readable medium in packaging materials. In view of the above, in some implementations, the storage medium 1904 may be a non-transitory (e.g., tangible) storage medium. For example, the storage medium 1904 may be a non-transitory computer-readable medium storing computer-executable code, including code to perform operations as described herein.

The storage medium 1904 may be coupled to the processing circuit 1910 such that the processing circuit 1910 can read information from, and write information to, the storage medium 1904. That is, the storage medium 1904 can be coupled to the processing circuit 1910 so that the storage medium 1904 is at least accessible by the processing circuit 1910, including examples where at least one storage medium is integral to the processing circuit 1910 and/or examples where at least one storage medium is separate from the processing circuit 1910 (e.g., resident in the apparatus 1900, external to the apparatus 1900, distributed across multiple entities, etc.).

Programming stored by the storage medium 1904, when executed by the processing circuit 1910, causes the processing circuit 1910 to perform one or more of the various functions and/or process operations described herein. For example, the storage medium 1904 may include operations configured for regulating operations at one or more hardware blocks of the processing circuit 1910, as well as to utilize the communication interface 1902 for wireless communication utilizing their respective communication protocols.

The processing circuit 1910 is generally adapted for processing, including the execution of such programming stored on the storage medium 1904. As used herein, the terms "code" or "programming" shall be construed broadly to include without limitation instructions, instruction sets, data, code, code segments, program code, programs, programming, subprograms, software modules, applications, software applications, software packages, routines, subroutines, objects, executables, threads of execution, procedures, functions, etc., whether referred to as software, firmware, middleware, microcode, hardware description language, or otherwise.

The processing circuit 1910 is arranged to obtain, process and/or send data, control data access and storage, issue commands, and control other desired operations. The processing circuit 1910 may include circuitry configured to implement desired programming provided by appropriate media in at least one example. For example, the processing circuit 1910 may be implemented as one or more processors, one or more controllers, and/or other structure configured to execute executable programming Examples of the processing circuit 1910 may include a general purpose processor, a digital signal processor (DSP), an ASIC, a field programmable gate array (FPGA) or other programmable logic component, discrete gate or transistor logic, discrete hardware components, or any combination thereof designed to perform the functions described herein. A general purpose processor may include a microprocessor, as well as any conventional processor, controller, microcontroller, or state machine. The processing circuit 1910 may also be implemented as a combination of computing components, such as a combination of a controller and a microprocessor, a number of microprocessors, one or more microprocessors in conjunction with an ASIC and a microprocessor, or any other number of varying configurations. These examples of the processing circuit 1910 are for illustration and other suitable configurations within the scope of the disclosure are also contemplated.

According to one or more aspects of the disclosure, the processing circuit 1910 may be adapted to perform any or all of the features, processes, functions, operations and/or routines for any or all of the controller apparatuses described herein. For example, the processing circuit 1910 may be configured to perform any of the steps, functions, and/or processes described with respect to FIGS. 1 and 10-11. As used herein, the term "adapted" in relation to the processing circuit 1910 may refer to the processing circuit 1910 being one or more of configured, employed, implemented, and/or programmed to perform a particular process, function, operation and/or routine according to various features described herein. The processing circuit 1910 may be a specialized processor, such as an ASIC that serves as a means for (e.g., structure for) carrying out any one of the operations described in conjunction with FIGS. FIGS. 1 and 10-11. The processing circuit 1910 serves as one example of a means for processing. In various implementations, the processing circuit 1910 may provide and/or incorporate, at least in part, the functionality described above for the controller 108 of FIG. 1.

According to at least one example of the apparatus 1900, the processing circuit 1910 may include one or more of: a circuit/module 1920 for storing neural network input data in an NVM (such as a NAND die); a circuit/module 1922 for storing neural network training data in an NVM (such as a NAND die); a circuit/module 1924 for receiving and processing neural network output data (e.g. from a NAND die); a circuit/module 1926 for generating and maintaining first FTL mapping table (such as the first table 1002 of FIG. 10); a circuit/module 1928 for generating and maintaining second FTL mapping table (such as the second table 1008 of FIG. 10); a circuit/module 1930 for converting neural network weight units to logical-block-IDS using the first table; a circuit/module 1932 for converting virtual-block-IDs to physical-block-IDs using the second table; and a circuit/module 1934 for applying PBAs received from the NVM to the second FTL table to update values in second FTL table.

As mentioned above, a program stored by the storage medium 1904, when executed by the processing circuit 1910, causes the processing circuit 1910 to perform one or more of the various functions and/or process operations described herein. For example, the program may cause the processing circuit 1910 to perform and/or control the various functions, steps, and/or processes described herein with respect to FIGS. 1-18, including operations performed by a NAND die. As shown in FIG. 19, the storage medium 1904 may include one or more of: code 1940 for storing neural network input data in the NVM (such as in a NAND die); code 1942 for storing neural network training data in NVM (such as in a NAND die); code 1944 for receiving and processing neural network output data (such as from a NAND die); code 1946 for generating and maintaining a first FTL mapping table; code 1948 for generating and maintaining a second FTL mapping table; code 1950 for converting neural network weight units to virtual-block-ID's using a first FTL mapping table; code 1952 for converting virtual-block-ID's to physical-block-ID's using a second FTL mapping table; code 1954 for applying PBAs received from the NVM (such as from a NAND) to the second FTL table to update values in second FTL table.

In at least some examples, means may be provided for performing the functions illustrated in FIG. 19 and/or other functions illustrated or described herein. For example, the means may include one or more of: means, such as circuit/module 1920, for storing neural network input data in an NVM (such as a NAND die); means, such as circuit/module 1922, for storing neural network training data in an NVM (such as a NAND die); means, such as circuit/module 1924, for receiving and processing neural network output data (e.g. from a NAND die); means, such as circuit/module 1926, for generating and maintaining first FTL mapping table (such as the first table 1002 of FIG. 10); means, such as circuit/module 1928, for generating and maintaining second FTL mapping table (such as the second table 1008 of FIG. 10); means, such as circuit/module 1930, for converting neural network weight units to logical-block-IDS using the first table; means, such as circuit/module 1932, for converting virtual-block-IDs to physical-block-IDs using the second table; and means, such as circuit/module 1934, for applying PBAs received from the NVM to the second FTL table to update values in second FTL table.

Additional Aspects

Aspects of the subject matter described herein can be implemented in any suitable NAND flash memory, such as 3D NAND flash memory. Semiconductor memory devices include volatile memory devices, such as DRAM) or SRAM devices, NVM devices, such as ReRAM, EEPROM, flash memory (which can also be considered a subset of EEPROM), ferroelectric random access memory (FRAM), and MRAM, and other semiconductor elements capable of storing information. Each type of memory device may have different configurations. For example, flash memory devices may be configured in a NAND or a NOR configuration. As noted, some features described herein are specific to NAND-based devices, such as the NAND-based on-chip copy with update.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured. The semiconductor memory elements located within and/or over a substrate may be arranged in two or three dimensions, such as a two dimensional memory structure or a three dimensional memory structure.

In a two dimensional memory structure, the semiconductor memory elements are arranged in a single plane or a single memory device level. Typically, in a two dimensional memory structure, memory elements are arranged in a plane (e.g., in an x-y direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon. The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the z direction is substantially perpendicular and the x and y directions are substantially parallel to the major surface of the substrate). As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the z direction) with each column having multiple memory elements in each column. The columns may be arranged in a two dimensional configuration, e.g., in an x-y plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-y) memory device levels. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Then again, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements. One of skill in the art will recognize that the subject matter described herein is not limited to the two dimensional and three dimensional exemplary structures described but cover all relevant memory structures within the spirit and scope of the subject matter as described herein and as understood by one of skill in the art.

The examples set forth herein are provided to illustrate certain concepts of the disclosure. The apparatus, devices, or components illustrated above may be configured to perform one or more of the methods, features, or steps described herein. Those of ordinary skill in the art will comprehend that these are merely illustrative in nature, and other examples may fall within the scope of the disclosure and the appended claims. Based on the teachings herein those skilled in the art should appreciate that an aspect disclosed herein may be implemented independently of any other aspects and that two or more of these aspects may be combined in various ways. For example, an apparatus may be implemented or a method may be practiced using any number of the aspects set forth herein. In addition, such an apparatus may be implemented or such a method may be practiced using other structure, functionality, or structure and functionality in addition to or other than one or more of the aspects set forth herein.

Aspects of the present disclosure have been described above with reference to schematic flowchart diagrams and/or schematic block diagrams of methods, apparatus, systems, and computer program products according to embodiments of the disclosure. It will be understood that each block of the schematic flowchart diagrams and/or schematic block diagrams, and combinations of blocks in the schematic flowchart diagrams and/or schematic block diagrams, can be implemented by computer program instructions. These computer program instructions may be provided to a processor of a computer or other programmable data processing apparatus to produce a machine, such that the instructions, which execute via the processor or other programmable data processing apparatus, create means for implementing the functions and/or acts specified in the schematic flowchart diagrams and/or schematic block diagrams block or blocks.

The subject matter described herein may be implemented in hardware, software, firmware, or any combination thereof. As such, the terms "function," "module," and the like as used herein may refer to hardware, which may also include software and/or firmware components, for implementing the feature being described. In one example implementation, the subject matter described herein may be implemented using a computer readable medium having stored thereon computer executable instructions that when executed by a computer (e.g., a processor) control the computer to perform the functionality described herein. Examples of computer readable media suitable for implementing the subject matter described herein include non-transitory computer-readable media, such as disk memory devices, chip memory devices, programmable logic devices, and application specific integrated circuits. In addition, a computer readable medium that implements the subject matter described herein may be located on a single device or computing platform or may be distributed across multiple devices or computing platforms.

It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. Other steps and methods may be conceived that are equivalent in function, logic, or effect to one or more blocks, or portions thereof, of the illustrated figures. Although various arrow types and line types may be employed in the flowchart and/or block diagrams, they are understood not to limit the scope of the corresponding embodiments. For instance, an arrow may indicate a waiting or monitoring period of unspecified duration between enumerated steps of the depicted embodiment.

The various features and processes described above may be used independently of one another, or may be combined in various ways. All possible combinations and sub-combinations are intended to fall within the scope of this disclosure. In addition, certain method, event, state or process blocks may be omitted in some implementations. The methods and processes described herein are also not limited to any particular sequence, and the blocks or states relating thereto can be performed in other sequences that are appropriate. For example, described tasks or events may be performed in an order other than that specifically disclosed, or multiple may be combined in a single block or state. The example tasks or events may be performed in serial, in parallel, or in some other suitable manner. Tasks or events may be added to or removed from the disclosed example embodiments. The example systems and components described herein may be configured differently than described. For example, elements may be added to, removed from, or rearranged compared to the disclosed example embodiments.

Those of skill in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The word "exemplary" is used herein to mean "serving as an example, instance, or illustration." Any aspect described herein as "exemplary" is not necessarily to be construed as preferred or advantageous over other aspects. Likewise, the term "aspects" does not require that all aspects include the discussed feature, advantage or mode of operation.

While the above descriptions contain many specific embodiments of the invention, these should not be construed as limitations on the scope of the invention, but rather as examples of specific embodiments thereof. Accordingly, the scope of the invention should be determined not by the embodiments illustrated, but by the appended claims and their equivalents. Moreover, reference throughout this specification to "one embodiment," "an embodiment," or similar language means that a particular feature, structure, or characteristic described in connection with the embodiment is included in at least one embodiment of the present disclosure. Thus, appearances of the phrases "in one embodiment," "in an embodiment," and similar language throughout this specification may, but do not necessarily, all refer to the same embodiment, but mean "one or more but not all embodiments" unless expressly specified otherwise.

The terminology used herein is for the purpose of describing particular aspects only and is not intended to be limiting of the aspects. As used herein, the singular forms "a," "an" and "the" are intended to include the plural forms as well (i.e., one or more), unless the context clearly indicates otherwise. An enumerated listing of items does not imply that any or all of the items are mutually exclusive and/or mutually inclusive, unless expressly specified otherwise. It will be further understood that the terms "comprises," "comprising," "includes" "including," "having," an variations thereof when used herein mean "including but not limited to" unless expressly specified otherwise. That is, these terms may specify the presence of stated features, integers, steps, operations, elements, or components, but do not preclude the presence or addition of one or more other features, integers, steps, operations, elements, components, or groups thereof. Moreover, it is understood that the word "or" has the same meaning as the Boolean operator "OR," that is, it encompasses the possibilities of "either" and "both" and is not limited to "exclusive or" ("XOR"), unless expressly stated otherwise. It is also understood that the symbol "/" between two adjacent words has the same meaning as "or" unless expressly stated otherwise. Moreover, phrases such as "connected to," "coupled to" or "in communication with" are not limited to direct connections unless expressly stated otherwise.

Any reference to an element herein using a designation such as "first," "second," and so forth does not generally limit the quantity or order of those elements. Rather, these designations may be used herein as a convenient method of distinguishing between two or more elements or instances of an element. Thus, a reference to first and second elements does not mean that only two elements may be used there or that the first element must precede the second element in some manner. Also, unless stated otherwise a set of elements may include one or more elements. In addition, terminology of the form "at least one of A, B, or C" or "A, B, C, or any combination thereof" used in the description or the claims means "A or B or C or any combination of these elements." For example, this terminology may include A, or B, or C, or A and B, or A and C, or A and B and C, or 2A, or 2B, or 2C, or 2A and B, and so on. As a further example, "at least one of: A, B, or C" is intended to cover A, B, C, A-B, A-C, B-C, and A-B-C, as well as multiples of the same members (e.g., any lists that include AA, BB, or CC). Likewise, "at least one of: A, B, and C" is intended to cover A, B, C, A-B, A-C, B-C, and A-B-C, as well as multiples of the same members. Similarly, as used herein, a phrase referring to a list of items linked with "and/or" refers to any combination of the items. As an example, "A and/or B" is intended to cover A alone, B alone, or A and B together. As another example, "A, B and/or C" is intended to cover A alone, B alone, C alone, A and B together, A and C together, B and C together, or A, B, and C together.

As used herein, the term "determining" encompasses a wide variety of actions. For example, "determining" may include calculating, computing, processing, deriving, investigating, looking up (e.g., looking up in a table, a database or another data structure), ascertaining, and the like. Also, "determining" may include receiving (e.g., receiving information), accessing (e.g., accessing data in a memory), and the like. Also, "determining" may include resolving, selecting, choosing, establishing, and the like.

What is claimed is:

1. An apparatus, comprising:
   a non-volatile memory (NVM) array comprising a memory die, the NVM array configured to perform an on-chip neural network learning operation that comprises reading a weight unit from one or more source blocks within the NVM array, modifying the weight unit in accordance with the neural network learning operation, and writing the modified weight unit to a target block in the NVM array; and
   a processor coupled to the NVM array and configured to
      generate a first mapping table that stores initial weight units and corresponding virtual block identifiers and maps the initial weight units to corresponding virtual locations within the NVM array via the virtual block identifiers, wherein the initial weight units correspond to initial synaptic weights of a neural network,
      generate a second mapping table that stores the virtual block identifiers and corresponding initial physical block identifiers and maps the virtual block identifiers to corresponding physical locations within the NVM array via the initial physical block identifiers,
      send, to the NVM array, a particular physical block identifier that corresponds to the one or more source blocks, wherein the particular physical block identifier is obtained from the second mapping table,
      receive a command completion response from the NVM array that notifies the processor that the on-chip neural network learning operation has completed and provides updated physical block identifiers of one or more weight units that have been changed by the on-chip neural network learning operation at the NVM array, and
      update the initial physical block identifiers within the second mapping table that correspond to the one or more weight units that have been changed within the NVM array, wherein the initial physical block identifiers are updated with the updated physical block identifiers.

2. The apparatus of claim 1, wherein the NVM array comprises NAND flash elements.

3. The apparatus of claim 1,
wherein the on-chip neural network learning operation comprises a backpropagation operation that changes the one or more initial weight units, and
wherein the command completion response identifies the updated physical block identifiers for the one or more weight units that have been changed during the backpropagation operation.

4. The apparatus of claim 3,
wherein the on-chip neural network learning operation further comprises a feedforward operation, and
wherein the processor is further configured to send the updated physical block identifiers to the NVM array to perform the feedforward operation on the one or more weight units that were changed during the backpropagation operation.

5. The apparatus of claim 1,
wherein the NVM array comprises single-bit-per-cell blocks and multiple-bit-per-cell blocks, and wherein each single-bit-per-cell block corresponds to a single one of the virtual block identifiers and each multiple-bit-per-cell block corresponds to two or more of the virtual block identifiers,
wherein the processor is further configured to generate the second mapping table by mapping each virtual block identifier either to a corresponding single-bit-per-cell block or to a portion of a corresponding multiple-bit-per-cell block, and
wherein the source block is one of the single-bit-per-cell blocks and wherein the target block includes at least one of the multiple-bit-per-cell blocks.

6. The apparatus of claim 5,
wherein the NVM memory array is further configured to perform a fold operation in which the one or more initial weight units are read from a plurality of the single-bit-per-cell blocks, are changed in accordance with an on-chip backpropagation procedure, and are folded into at least one of the multiple-bit-per-cell blocks, and
wherein the processor is further configured to apply the updated physical block identifiers received from the NVM array to the second mapping table to update the second mapping table to match the fold operation without updating corresponding values within the first mapping table.

7. The apparatus of claim 1, wherein the processor is further configured to allocate the target block in the NVM array for use by the on-chip neural network learning operation and to then release the one or more source blocks after the command completion response is received.

8. A method for use by a controller of an apparatus that includes a memory array of non-volatile memory (NVM) elements, the method comprising:
generating a first mapping table that stores initial weight units and corresponding virtual block identifiers and maps the initial weight units to corresponding virtual locations within the memory array via the virtual block identifiers, wherein the initial weight units correspond to initial synaptic weights of a neural network;
generating a second mapping table that stores the virtual block identifiers and corresponding initial physical block identifiers and maps the virtual block identifiers to corresponding physical locations within the memory array via the initial physical block identifiers;
converting a particular initial weight unit to a particular virtual block identifier using the first table;
converting the particular virtual block identifier to a particular initial physical block identifier using the second table;
sending the particular initial physical block identifier to the memory array for processing by an on-chip neural network learning operation within the memory array that comprises reading the initial weight unit from one or more source blocks within the memory array, modifying the initial weight unit in accordance with the neural network learning operation, and writing the modified weight unit to a target block in the memory array;
receiving a command completion response from the memory array that notifies the controller that the on-chip neural network learning operation has completed and provides updated physical block identifiers of one or more weight units that have been changed by the on-chip neural network learning operation at the memory array; and
updating the initial physical block identifiers within the second mapping table that correspond to the one or more weight units that have been changed by the memory array wherein the initial physical block identifiers are updated with the updated physical block identifiers.

9. The method of claim 8,
wherein the on-chip neural network learning operation comprises a backpropagation operation that changes the one or more initial weight units, and
wherein the command completion response identifies the updated physical block identifiers for the one or more initial weight units changed during the backpropagation operation.

10. The method of claim 9,
wherein the on-chip neural network learning operation further comprises a feedforward operation, and
wherein the method further comprises sending the updated physical block identifiers to the memory array to perform the feedforward operation on the one or more weight units that were changed during the backpropagation operation.

11. The method of claim 8,
wherein the memory array comprises single-bit-per-cell blocks and multiple-bit-per-cell blocks, and wherein each single-bit-per-cell block corresponds to a single one of the virtual block identifiers and each multiple-bit-per-cell block corresponds to two or more of the virtual block identifiers,
wherein the method further comprises generating the second mapping table by mapping each virtual block identifier either to a corresponding single-bit-per-cell block or to a portion of a corresponding multiple-bit-per-cell block, and
wherein the source block is one of the single-bit-per-cell blocks and wherein the target block includes at least one of the multiple-bit-per-cell blocks.

12. The method of claim 11,
wherein the memory array is configured to perform a fold operation in which the one or more initial weight units are read from a plurality of the single-bit-per-cell blocks, are updated in accordance with an on-chip backpropagation procedure, and are folded into at least one of the multiple-bit-per-cell blocks, and
wherein the method further comprises applying the updated physical block identifiers received from the memory array to the second mapping table to update the second mapping table to match the fold operation without updating corresponding values within the first mapping table.

13. The method of claim 8, further comprising allocating the target block in the memory array for use by the on-chip neural network learning operation and then releasing the one or more source blocks after the command completion response is received.

14. An apparatus for use with a non-volatile memory (NVM) array, the apparatus comprising:
- means for generating a first mapping table that stores initial weight units and corresponding virtual block identifiers and maps the initial weight units to corresponding virtual locations within the memory array via the virtual block identifiers, wherein the initial weight units correspond to initial synaptic weights of a neural network;
- means for generating a second mapping table that stores the virtual block identifiers and corresponding initial physical block identifiers and maps the virtual block identifiers to corresponding physical locations within the memory array via the initial physical block identifiers;
- means for converting a particular initial weight unit to a particular virtual block identifier using the first table;
- means for converting the particular virtual block identifier to a particular initial physical block identifier using the second table;
- means for sending the particular initial physical block identifier to a memory die of the NVM array for processing by an on-chip neural network learning operation that reads the initial weight unit from one or more source blocks within the NVM array, modifies the initial weight unit in accordance with the neural network learning operation, and writes the modified weight unit to a target block in the NVM array;
- means for receiving a command completion response from the NVM array indicating that the on-chip neural network learning operation has completed, wherein the command completion response provides updated physical block identifiers of one or more weight units that have been changed by the on-chip neural network learning operation at the NVM array; and
- means for updating the initial physical block identifiers within the second mapping table of the one or more weight units that have been changed, wherein the initial physical block identifiers are updated with the updated physical block identifiers.

15. The apparatus of claim 14,
wherein the on-chip neural network learning operation comprises a backpropagation operation that changes the one or more initial weight units, and
wherein the command completion response identifies the updated physical block identifiers for the one or more initial weight units changed during the backpropagation operation.

16. The apparatus of claim 15,
wherein the on-chip neural network learning operation further comprises a feedforward operation, and
wherein the apparatus further comprises means for sending the updated physical block identifiers to the NVM array to perform the feedforward operation on the one or more weight units that were changed during the backpropagation operation.

17. The apparatus of claim 14, further comprising means for allocating the target block in the NVM array for use by the on-chip neural network learning operation and means for releasing the one or more source blocks after the command completion response is received.

18. An apparatus, comprising:
- a non-volatile memory (NVM) array comprising a memory die, the NVM array configured to perform an on-chip neural network learning operation that reads a weight unit from one or more source blocks within the NVM array, modifies the weight unit in accordance with the neural network learning operation, and writes the modified weight unit to a target block in the NVM array;
- an allocation component configured to allocate the target block in the NVM array for the one or more source blocks for use by the on-chip neural network learning operation;
- an output component configured to send, to the NVM array, a particular physical block identifier that corresponds to the one or more source blocks;
- a receive component configured to receive a command completion response indicating that the on-chip neural network learning operation has completed, wherein the command completion response provides the updated physical block identifiers of one or more weight units that have been changed by the on-chip neural network learning operation at the NVM array;
- a release component configured to release the one or more source blocks; and
- an update component configured to update physical block identifiers within a mapping table that correspond to the one or more weight units that have been changed within the NVM array, wherein the physical block identifiers are updated with the updated physical block identifiers.

19. The apparatus of claim 18, wherein the NVM array comprises NAND flash elements.

20. The apparatus of claim 18, wherein the one or more weight units include one or more initial synaptic weight values.

* * * * *